(12) United States Patent
Guerdrum et al.

(10) Patent No.: US 9,807,211 B2
(45) Date of Patent: *Oct. 31, 2017

(54) PROTECTIVE MODULAR CASE FOR ELECTRONIC DEVICE

(71) Applicant: Otter Products, LLC, Fort Collins, CO (US)

(72) Inventors: Jonathan H. Guerdrum, Fort Collins, CO (US); Russell J. Goldfain, Fort Collins, CO (US); John P. Fitzgerald, Fort Collins, CO (US); Jonathan B. Rayeski, Fort Collins, CO (US); Cameron D. Magness, Fort Collins, CO (US)

(73) Assignee: Otter Products, LLC, Fort Collins, CO (US)

( * ) Notice: Subject to any disclaimer, the term of this patent is extended or adjusted under 35 U.S.C. 154(b) by 87 days.

This patent is subject to a terminal disclaimer.

(21) Appl. No.: 15/062,399

(22) Filed: Mar. 7, 2016

(65) Prior Publication Data

US 2017/0019512 A1    Jan. 19, 2017

Related U.S. Application Data

(60) Provisional application No. 62/194,244, filed on Jul. 19, 2015, provisional application No. 62/257,303, (Continued)

(51) Int. Cl.
*H04M 1/00* (2006.01)
*H04M 1/02* (2006.01)
(Continued)

(52) U.S. Cl.
CPC .......... *H04M 1/0264* (2013.01); *A45C 11/00* (2013.01); *A45C 13/001* (2013.01); *A45C 15/00* (2013.01);
(Continued)

(58) Field of Classification Search
USPC ................. 455/556.1; 206/32; 403/322.4
See application file for complete search history.

(56) References Cited

U.S. PATENT DOCUMENTS

| | | |
|---|---|---|
| 3,023,885 A | 3/1962 | Kindseth |
| 4,029,999 A | 6/1977 | Neumann et al. |

(Continued)

FOREIGN PATENT DOCUMENTS

| | | |
|---|---|---|
| CN | 202488509 U | 10/2012 |
| KR | 200446444 | 10/2009 |

(Continued)

*Primary Examiner* — David Q Nguyen

(57) ABSTRACT

A protective case for an electronic device includes an inner liner, a first aperture, a second aperture, and an outer shell. The inner liner receives the electronic device and the first aperture permits access to a touchscreen interface of the electronic device. The second aperture permits optical access to a camera of the installed electronic device. The outer shell includes an attachment mechanism for attaching an accessory. The attachment mechanism includes a receiver channel to slidably receive a rail member of the accessory to removably attach the accessory to the protective case. The receiver channel includes a lip for retaining the rail member in the receiver channel. The attachment mechanism further includes a snap feature having an interference fit with a corresponding snap feature of the rail member to removably lock the rail member into the receiver channel when the rail member is inserted into the receiver channel.

31 Claims, 20 Drawing Sheets

Related U.S. Application Data filed on Nov. 19, 2015, provisional application No. 62/274,209, filed on Jan. 1, 2016.

(51) Int. Cl.

| | | |
|---|---|---|
| *H04M 1/18* | (2006.01) | |
| *H04B 1/3888* | (2015.01) | |
| *A45C 11/00* | (2006.01) | |
| *A45F 5/00* | (2006.01) | |
| *G06F 1/16* | (2006.01) | |
| *H04M 1/04* | (2006.01) | |
| *H05K 5/02* | (2006.01) | |
| *A45F 5/02* | (2006.01) | |
| *A45C 13/00* | (2006.01) | |
| *A45C 15/00* | (2006.01) | |

(52) U.S. Cl.
CPC ............... *A45F 5/00* (2013.01); *A45F 5/021* (2013.01); *G06F 1/1613* (2013.01); *H04B 1/3888* (2013.01); *H04M 1/0266* (2013.01); *H04M 1/04* (2013.01); *H04M 1/185* (2013.01); *H05K 5/0221* (2013.01); *A45C 2011/001* (2013.01); *A45C 2011/002* (2013.01); *A45C 2011/003* (2013.01); *A45C 2011/007* (2013.01); *A45F 2005/002* (2013.01); *A45F 2200/0516* (2013.01); *A45F 2200/0525* (2013.01)

(56) References Cited

U.S. PATENT DOCUMENTS

| | | |
|---|---|---|
| 4,097,878 A | 6/1978 | Cramer |
| 4,584,718 A | 4/1986 | Fuller |
| 5,025,921 A | 6/1991 | Gasparaitis et al. |
| 5,123,044 A | 6/1992 | Tate |
| 5,138,523 A | 8/1992 | Benck et al. |
| 5,360,108 A | 11/1994 | Alagia |
| 5,368,159 A | 11/1994 | Doria |
| 5,380,968 A | 1/1995 | Morse |
| 5,383,091 A | 1/1995 | Snell |
| 5,386,084 A | 1/1995 | Risko |
| 5,388,691 A | 2/1995 | White |
| 5,388,692 A | 2/1995 | Withrow et al. |
| 5,508,479 A | 4/1996 | Schooley |
| 5,541,813 A | 7/1996 | Satoh et al. |
| 5,671,120 A | 9/1997 | Kikinisi |
| 6,115,248 A | 9/2000 | Canova et al. |
| 6,311,017 B1 | 10/2001 | Mori |
| 6,317,313 B1 | 11/2001 | Mosgrove et al. |
| 6,349,824 B1 | 2/2002 | Yamada |
| 6,375,009 B1 | 4/2002 | Lee |
| 6,445,577 B1 | 9/2002 | Madsen et al. |
| 6,456,487 B1 | 9/2002 | Hetterick |
| 6,490,155 B2 | 12/2002 | Han et al. |
| 6,545,862 B1 | 4/2003 | Gettemy et al. |
| 6,616,111 B1 | 9/2003 | White |
| 6,625,394 B2 | 9/2003 | Smith et al. |
| 6,626,362 B1 | 9/2003 | Steiner et al. |
| 6,701,159 B1 | 3/2004 | Powell |
| 6,762,935 B2 | 7/2004 | Hidewasa |
| 6,865,076 B2 | 3/2005 | Lunsford |
| 7,050,841 B1 | 5/2006 | Onda |
| 7,072,699 B2 | 7/2006 | Eiden |
| 7,194,291 B2 | 3/2007 | Peng |
| 7,236,588 B2 | 6/2007 | Gartrell |
| 7,343,184 B2 | 3/2008 | Rostami |
| 7,359,184 B2 | 4/2008 | Lord |
| 7,555,325 B2 | 6/2009 | Goros |
| 7,558,594 B2 | 7/2009 | Wilson |
| 7,688,580 B2 | 3/2010 | Richardson et al. |
| 7,889,489 B2 | 2/2011 | Richardson et al. |
| 7,907,394 B2 | 3/2011 | Richardson et al. |
| 7,933,122 B2 | 4/2011 | Richardson et al. |
| 8,049,727 B2 | 11/2011 | Hanson et al. |
| 8,442,604 B1 | 5/2013 | Diebel |
| 8,453,344 B2 | 6/2013 | Nishiwaki et al. |
| 8,457,701 B2 | 6/2013 | Diebel |
| 8,490,783 B1 | 7/2013 | Fan |
| 8,567,599 B2 | 10/2013 | Beatty et al. |
| 8,599,547 B2 | 12/2013 | Richardson et al. |
| 8,755,852 B2 | 6/2014 | Hynecek et al. |
| 8,777,002 B2 | 7/2014 | Thomas et al. |
| 8,798,675 B2 | 8/2014 | Salmon et al. |
| 8,965,458 B2 | 2/2015 | Richardson et al. |
| 9,008,738 B1 | 4/2015 | Dong |
| 9,060,580 B2 | 6/2015 | Tages |
| 9,089,056 B2 * | 7/2015 | Rayner ................. G06F 1/1626 |
| 9,098,238 B2 | 8/2015 | Richardson et al. |
| 9,125,297 B2 | 9/2015 | Magness |
| 2002/0065054 A1 | 5/2002 | Humphreys et al. |
| 2002/0079244 A1 | 6/2002 | Kwong |
| 2005/0088811 A1 | 4/2005 | Ulla et al. |
| 2005/0224508 A1 | 10/2005 | Tajiri et al. |
| 2005/0279661 A1 | 12/2005 | Hodges |
| 2006/0172765 A1 | 8/2006 | Lev |
| 2006/0255493 A1 | 11/2006 | Fouladpour |
| 2007/0071423 A1 | 3/2007 | Fantone et al. |
| 2007/0115387 A1 | 5/2007 | Ho |
| 2007/0146985 A1 | 6/2007 | Mick et al. |
| 2007/0158220 A1 | 7/2007 | Cleereman et al. |
| 2007/0297149 A1 | 12/2007 | Richardson et al. |
| 2008/0163463 A1 | 7/2008 | Hulden |
| 2009/0034169 A1 | 2/2009 | Richardson et al. |
| 2009/0237377 A1 | 9/2009 | Lai et al. |
| 2009/0283184 A1 | 11/2009 | Han |
| 2010/0006468 A1 | 1/2010 | Lin |
| 2010/0093412 A1 | 4/2010 | Serra et al. |
| 2010/0122756 A1 | 5/2010 | Longinotti-Buitoni |
| 2010/0203931 A1 | 8/2010 | Hynecek et al. |
| 2011/0228459 A1 | 9/2011 | Richardson et al. |
| 2012/0018325 A1 | 1/2012 | Kim |
| 2012/0037536 A1 | 2/2012 | Thomas et al. |
| 2012/0287565 A1 | 11/2012 | Bennett |
| 2013/0027862 A1 | 1/2013 | Rayner |
| 2013/0088813 A1 | 4/2013 | Su et al. |
| 2013/0098788 A1 | 4/2013 | McCarville et al. |
| 2013/0175186 A1 | 7/2013 | Simmer |
| 2013/0220841 A1 | 8/2013 | Yang |
| 2013/0220847 A1 | 8/2013 | Fisher et al. |
| 2014/0049142 A1 | 2/2014 | Magness |
| 2014/0065847 A1 | 3/2014 | Salmon et al. |
| 2014/0099526 A1 | 4/2014 | Powell et al. |
| 2014/0183064 A1 | 7/2014 | Ge |
| 2014/0187289 A1 | 7/2014 | Cataldo et al. |
| 2014/0227026 A1 * | 8/2014 | O'Neill ................. G03B 15/06 403/322.4 |
| 2014/0228074 A1 | 8/2014 | Kulkarni et al. |
| 2014/0299488 A1 * | 10/2014 | Andrew ............... A45C 13/002 206/37 |
| 2014/0302896 A1 | 10/2014 | Xu et al. |
| 2016/0261133 A1 | 9/2016 | Wang |
| 2017/0026498 A1 * | 1/2017 | Goldfain .............. A45C 11/182 |

FOREIGN PATENT DOCUMENTS

| | | |
|---|---|---|
| KR | 101394285 | 5/2014 |
| WO | 1994000037 A1 | 1/1994 |
| WO | 1999041958 A1 | 8/1999 |
| WO | 2015103599 A1 | 7/2015 |

* cited by examiner

PROTECTIVE MODULAR CASE FOR ELECTRONIC DEVICE

CROSS REFERENCE TO RELATED APPLICATIONS

This application claims priority to U.S. Provisional Patent Application No. 62/194,244 filed Jul. 19, 2015, U.S. Provisional Patent Application No. 62/257,303 filed Nov. 19, 2015, and U.S. Provisional Patent Application No. 62/274,209 filed Jan. 1, 2016, all of which are expressly incorporated by reference in their entireties.

BACKGROUND

Personal electronic devices are commonly used for communication, entertainment, as well as a variety of other purposes. Examples of personal electronic devices include smartphones, tablet computers, gaming devices, audio players, video players, cameras, portable computers, two-way radios, GPS receivers, and/or other portable devices. As processing power, screen resolution, and other features increase, these devices are being used for an increasingly wide range of purposes. As these devices become an increasingly important part of peoples' daily activities, it is desirable to have protective cases that not only protect the electronic devices from damage, but also help flexibly adapt the devices to serve other useful purposes and/or perform other functions.

SUMMARY

In one example, a protective case for an electronic device is provided. The electronic device includes a touchscreen interface, a camera, and an external electrical interface. The protective case includes an inner liner, an outer shell, a first aperture, and a second aperture. The inner liner receives and at least partially encloses the electronic device. The first aperture permits access to the touchscreen interface of the electronic device when the electronic device is installed in the protective case. The second aperture is in a back surface of the protective case and permits optical access to the camera of the electronic device while it is installed in the protective case. The outer shell includes an attachment mechanism for attaching an accessory to the protective case. The attachment mechanism includes a receiver channel to slidably receive a rail member of the accessory to removably attach the accessory to the protective case. The receiver channel includes a lip for retaining the rail member in the receiver channel. The attachment mechanism also includes a snap feature. The snap feature has an interference fit with a corresponding snap feature of the rail member of the accessory to removably lock the rail member into the receiver channel of the outer shell when the rail member is fully inserted into the receiver channel.

In another example, a modular case system for use with an electronic device is provided. The electronic device has a touchscreen interface, a camera, and an external electrical interface. The modular case system includes an accessory module and a protective case. The accessory module has a rail member for attaching the accessory module to the protective case. The protective case includes an inner liner, a first aperture, a second aperture, and an outer shell. The inner liner is for receiving and at least partially enclosing the electronic device. The first aperture permits access to the touchscreen interface of the electronic device when the electronic device is installed in the protective case. The second aperture is in a back surface of the protective case and permits optical access to the camera of the installed electronic device. The outer shell includes an attachment mechanism for attaching the accessory module to the protective case. The attachment mechanism includes a receiver channel to slidably receive the rail member of the accessory module to removably attach the accessory module to the protective case. The receiver channel includes a lip for retaining the rail member in the channel. The attachment mechanism further includes a snap feature. The snap feature may have an interference fit with a corresponding snap feature of the rail member of the accessory module to removably lock the rail member into the receiver channel of the outer shell when the rail member is inserted into the receiver channel.

In yet another example, an accessory module for use with a protective case for an electronic device having an external electrical interface is provided. The accessory module includes a body member and a rail member. The rail member is attached to the body member. The rail member has a dovetail shape and is configured to slide into a corresponding dovetail receiver channel of the protective case for the electronic device to removably attach the accessory module to the protective case. The rail member includes a snap feature having an interference fit with a corresponding snap feature of the dovetail receiver channel to removably lock the rail member into the dovetail receiver channel of the protective case when the dovetail rail member is inserted into the dovetail receiver channel.

While several examples are provided above for purposes of illustration and description, other modifications and variations may be possible in view of the teachings herein. The embodiments described herein illustrate and explain the principles of the concept and its practical application to enable others skilled in the art to best utilize the invention.

DETAILED DESCRIPTION

Figure 1:
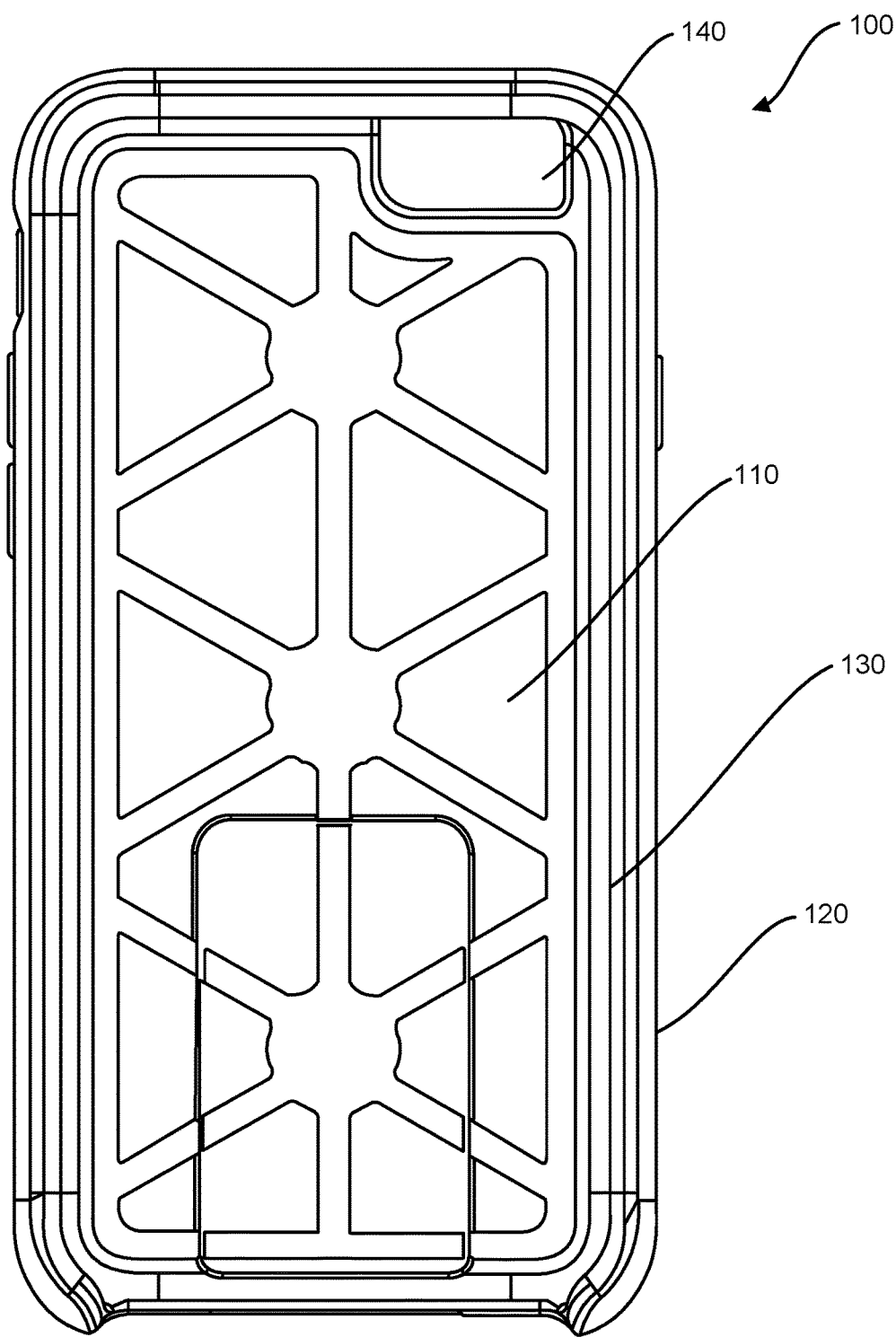
FIG. 1 illustrates a protective case in one example of the invention.

Electronic devices are increasingly used with protective cases that protect the electronic devices from a variety or forces or elements such as: dropping, impact, scratching, water, dirt, dust, rain, snow, and/or chemicals. As people carry electronic devices with them more frequently and become more interested in using them for a wider variety of tasks, there is an increasing desire to adapt the functionality of these electronic devices using external modules that provide different functions than those originally provided in the electronic device and/or in the protective case. Removable modules allow a user to adapt their electronic device to perform a number of new or different functions. Some of these removable modules may have electrical and/or electronic functions and may need to have an electrical interconnection to the electronic device and/or to the protective case. However, some removable modules may not require an electrical connection to one or both of the electronic device and the protective case. In some examples, a removable module may communicate with the electronic device and/or the protective case using one or more types of wireless communication technology.

In some situations it may be desirable to attach, detach, and/or use removable modules with an electronic device without taking the electronic device out of the protective case. Modules may include features and functions such as, but not limited to: communication functions, a supplemental camera, a flash, a lens, a battery, a power source, a power adapter, a solar panel, a game interface, a supplemental display, a sensor, a measurement device, a monitoring apparatus, a medical measurement device, a medical analysis device, an audio component, a video component, a mounting interface, a mounting function, a storage feature, a mechanical interface, a compartment for storing other objects, an electrical function, an additional electrical interface, and/or a decorative/ornamental attachment. Many other modules, features and functions are possible and the improvements described herein are not to be limited to any particular type of module or module function.

While most of the electronic device cases disclosed herein are described as "protective" cases, the apparatuses and techniques disclosed herein related to removable modules do not necessarily require that the case is protective and could apply to any type of electronic device case, cover, sleeve, sheath, attachment panel, etc. In other examples, the case may be water resistant or water proof for protecting the electronic device from water or other liquids. In yet other examples, the case may have other characteristics, such as but not limited to, chemical resistance and antimicrobial characteristics. Moreover, while the electronic device cases disclosed herein are generally understood to serve as aftermarket accessories for original equipment electronic devices (i.e., smartphones, tablet computers, gaming devices, audio players, video players, cameras, portable computers, two-way radios, GPS receivers, other portable devices, etc.), the apparatuses and techniques described herein could also be applied to the actual housings of original equipment electronic devices themselves.

FIG. 1 illustrates a protective case 100 for an electronic device (not pictured in FIG. 1) in one example of the invention. Protective case 100 includes an inner liner 110 and an outer shell 120. Inner liner 110 provides the primary surface(s) for receiving and holding the electronic device in the protective case. Inner liner 110 may contact the electronic device on any one or more of a back surface, on one or more side surfaces, and/or on a portion of a front surface of the electronic device. In some situations, inner liner 110 may also be referred to as a cushion layer. Inner liner 110 can be made of any suitable material such as an elastomer. The elastomer may be, but is not limited to, a thermoplastic elastomer or silicone rubber. Inner liner 110 typically comprises a material that is softer than a material of outer shell 120.

Inner liner 110 may be configured to cushion an installed electronic device from external forces, impacts, sudden acceleration, sudden deceleration, and other forces experienced at outer surfaces of protective case 100. Further, the compliant nature of inner liner 110 allows it to flexibly hold the electronic device to reduce movement, shifting, or rattling of the electronic device within protective case 100. Inner liner 100 may contain cavities, coring, reliefs, ribs, channels, recesses, a grid pattern, protrusions, and/or other similar features for holding the electronic device in place, for protecting the electronic device, and/or for potentially reducing the surface area of contact between inner liner 110 and the installed electronic device.

Figure 2:
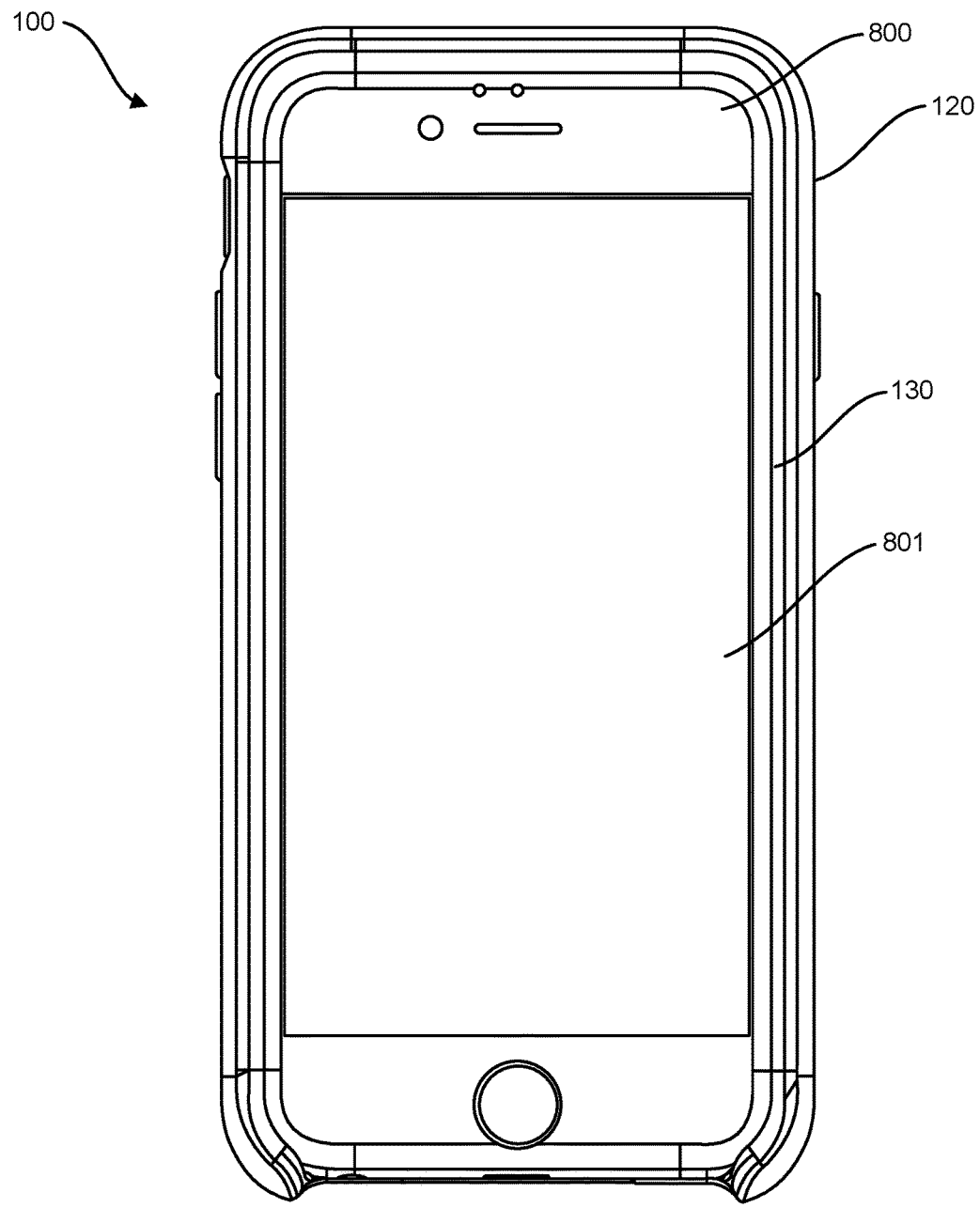
FIG. 2 illustrates a protective case with an electronic device installed in one example of the invention.

As discussed in further detail with respect to FIG. 2, protective case 100 also includes aperture 130 which permits or allows access to at least some portion of the installed electronic device. In one example, aperture 130 permits access to an interactive interface of the electronic device such as a touch screen, a touch screen interface, a resistive touchscreen, and/or a capacitive touchscreen. Aperture 130 may contain a lip or edge that removably retains the electronic device in the protective case such that it does not easily or readily come out of the protective case, but can still be intentionally removed by a user when desired. Aperture 130 may also include a lip, ledge, protrusion, raised edge, rim, elevated rim, elevated protective rim, or other raised feature around at least a portion of aperture 130 to reduce the chances of a front surface of the installed electronic device from coming into contact with another object or surface, particularly when protective case 100 is laid face down on a flat surface such as a table.

Protective case 100 also includes outer shell 120. Outer shell 120 may also be referred to as a structural layer, a frame, a rigid layer, a bottom shell, and/or a shell of protective case 100. Outer shell 120 extends around some or all of the outer surface of inner liner 110. Outer shell 120 will typically be manufactured from a material that is harder, more rigid, stiffer, more puncture resistant, more crush resistant, more chemical resistant, and/or more abrasion resistant than the material of inner liner 110. The material of outer shell 120 can be any suitable material such as a thermoplastic polymer or a synthetic polymer. The material can include polycarbonate, nylon, or glass filled nylon. Alternately, any other material, or combination of materials, that provide rigidity to protective enclosure 100 can be used. Outer shell 120 can be formed using any suitable process, such as an injection molding process. The back or sides of outer shell 120 may also include stylistic patterns, images, graphics, and/or colors.

Protective case 100 also includes aperture 140 in a back surface of protective case 100. Aperture 140 provides optical access and/or an optical path to/from a camera and/or a flash of an installed electronic device. In other words, aperture 140 permits use of the camera and/or flash even though the electronic device is installed in protective case 100 and much of the back of the electronic device is covered by protective case 100. Aperture 140 may be covered with a clear, mostly clear, transparent, or mostly transparent membrane or film that protects the camera and/or the flash but also still permits optical access and/or an optical path to/from the camera and/or flash. In some examples, the membrane or film may serve a lensing function and/or provide an optical effect.

Protective case 100 provides protection for an installed electronic device against external forces by reducing or eliminating transfer of those forces to the installed electronic device, as well as providing a relatively soft contact surface for the installed electronic device. The relatively soft contact surface can resist scratching, scraping, marring, and/or rub marks. While providing protection, protective case 100 enables a user to still use the electronic device while it is in protective case 100.

In one embodiment, one of inner liner 110 and outer shell 120 may be comolded (or co-molded) onto the other, comolded with the other, or overmolded onto the other. In another embodiment, they may be molded as separate pieces and adhered together after the molding process. In yet other embodiments, inner liner 110 and outer shell 120 may not be formed, molded, or adhered together but may fit together as an assembly. Inner liner 110 and outer shell 120 may have approximately the same thickness throughout protective enclosure 100 and in other embodiments can vary in thickness. The thickness can vary depending on the manufacturing process and/or the design of protective enclosure 100.

When inner liner 110 and outer shell 120 are formed, adhered, or fitted together, protective enclosure 100 may provide a one-piece construction that functions like, and provides benefits similar to, a more costly and possibly more complicated two-piece or three-piece assembly. However, it should be understood that the modular features of a protective case described herein are not to be limited to a protective case with an inner liner and an outer shell. It should be understood that the modular case improvements disclosed herein may be implemented in a case with a single layer (e.g., a hard rigid layer or a soft flexible layer), a case made of a single material (e.g., a polycarbonate, a silicone, etc.), a case made of a single component, a case with more than two layers, a case made of more than two materials, and/or a case made of more than two components. For example, the modular case improvements disclosed herein could be implemented into a clam shell case with two or more pieces, a sliding case with two or more pieces, a hinged case with two or more pieces, etc.

FIG. 2 illustrates protective case 100 with an electronic device 800 installed. Electronic device 800 includes touchscreen interface 801 that is partially or fully accessible by a user of the device through aperture 130 of protective case 100 when electronic device 800 is installed in protective case 100. Touchscreen interface 801 may also be referred to as a touch screen, a touch screen interface, a resistive touchscreen, a capacitive touchscreen, an interactive control panel, an interactive touchscreen, and/or the like. In some embodiments, protective case 100 may include a membrane or film that covers and/or protects some or all of touchscreen interface 801. The membrane or film may be partially or fully transparent such that touchscreen interface 801 is visible and operable through the film or membrane. In some embodiments, the membrane or film may be flexible. In other embodiments, the membrane or film may comprise a semi-rigid material or a rigid material, such as, for example, ruggedized glass.

Figure 3:
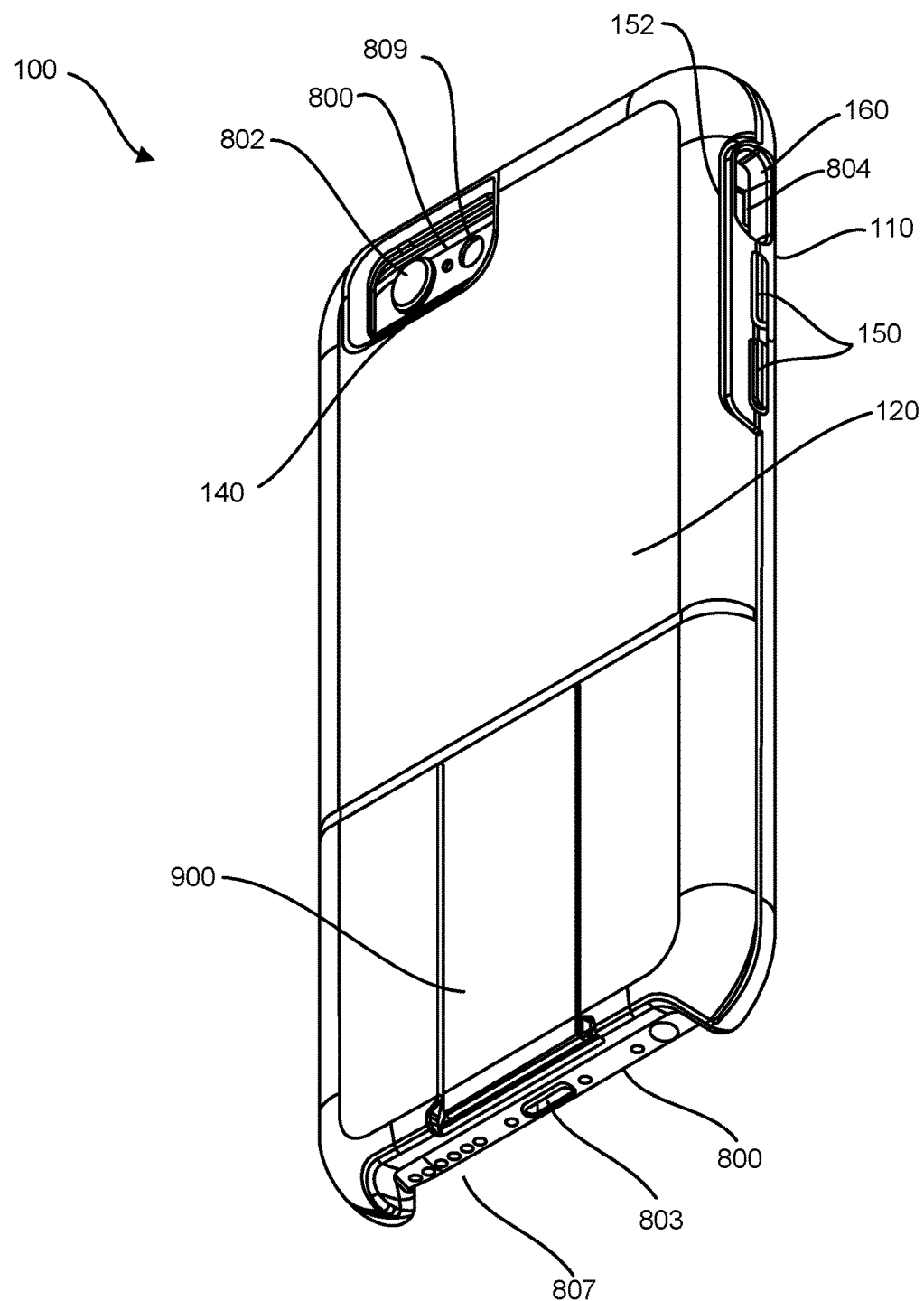
FIG. 3 illustrates a back perspective view of a protective case with an electronic device installed in one example of the invention.

FIG. 3 illustrates a back perspective view of a protective case 100 with electronic device 800 installed. Outer shell 120 covers a majority of the back portion of protective case 100, although this configuration is not required. Protective case 100 includes aperture 140 through outer shell 120 and inner liner 110 to provide optical access to/from camera 802 of electronic device 800. Aperture 140 also provides optical access to/from flash 809 of electronic device 800. Additional apertures or openings may also be included for providing access to/from other features of electronic device 800 while it is installed in protective case 100. Aperture 140 may be partially or fully covered with a membrane or film that is partially or fully transparent. The membrane or film may protect components of electronic device 800, seal protective case 100, and/or provide one or more optical filtering or lensing affects for camera 802, flash 809, and/or for another component of electronic device 800. Protective case 100 may also include features for reducing an amount of reflection from flash 809 back into camera 802 and/or for reducing other undesirable optical effects.

As illustrated in FIG. 3, a side of outer shell 120 includes a cutout 152 through which inner liner 110 is accessible, extends, and/or protrudes. Cutout 152 of outer shell 120 may also be referred to as a recess, a cut back, or a relief in the side of outer shell 120. In some embodiments cutout 152 may also be implemented as an aperture in outer shell 120. Cutout 152 enables inner liner 110 to be accessible at or near an outer surface of outer shell 120 such that a feature may be formed in inner liner 110 and be accessible at the outer surface of outer shell 120 and/or from outside protective case 100.

In one example, button pads 150 are formed in inner liner 110 and accessible through cutout 152. Button pads 150 correspond to respective buttons or control features of installed electronic device 800. Because inner liner 110 is relatively soft and/or pliable, button pads 150 enable actuation or operation of the respective buttons or control features of installed electronic device 800 from outside of protective case 800 without necessarily having direct access to the buttons or control features. Outer shell 120 and/or inner liner 110 may also include an aperture or opening, such as aperture 160, for directly accessing a button, switch, or control feature of the installed electronic device, such as switch 804 of electronic device 800. Button pads and apertures may have many other shapes or configurations. A protective case may have more or fewer button pads or apertures than illustrated, or no buttons or apertures at all.

Electronic device 800 also includes external electrical interface 803. External electrical interface 803 may be for transmitting and/or receiving electrical data communication signals to/from electronic device 800. External electrical interface 803 may also be for supplying electrical power to and/or receiving electrical power from electronic device 800. External electrical interface 803 may include or may be configured to mate with a standardized electrical plug or connector such as, for example, a USB connector, a mini USB connector, a micro USB connector, an APPLE LIGHTNING® connector, a proprietary electronic connector, and/or an electrical connector of another type.

Protective case 100 may also permit access to other features of installed electronic device 800. For example, protective case may permit access to an audio feature of electronic device 800, such as speaker 807 of electronic device 800. In some configurations, protective case 100 may include an aperture with a water impermeable membrane that allows sound to pass through the membrane while keeping water from passing through the associated aperture.

FIG. 3 also illustrates an accessory plate 900 installed on and removably attached to protective case 100. The features of accessory plate 900 and the way in which accessory plate 900 is attached to and removed from protective case 100 is described in further detail below.

Figure 4:
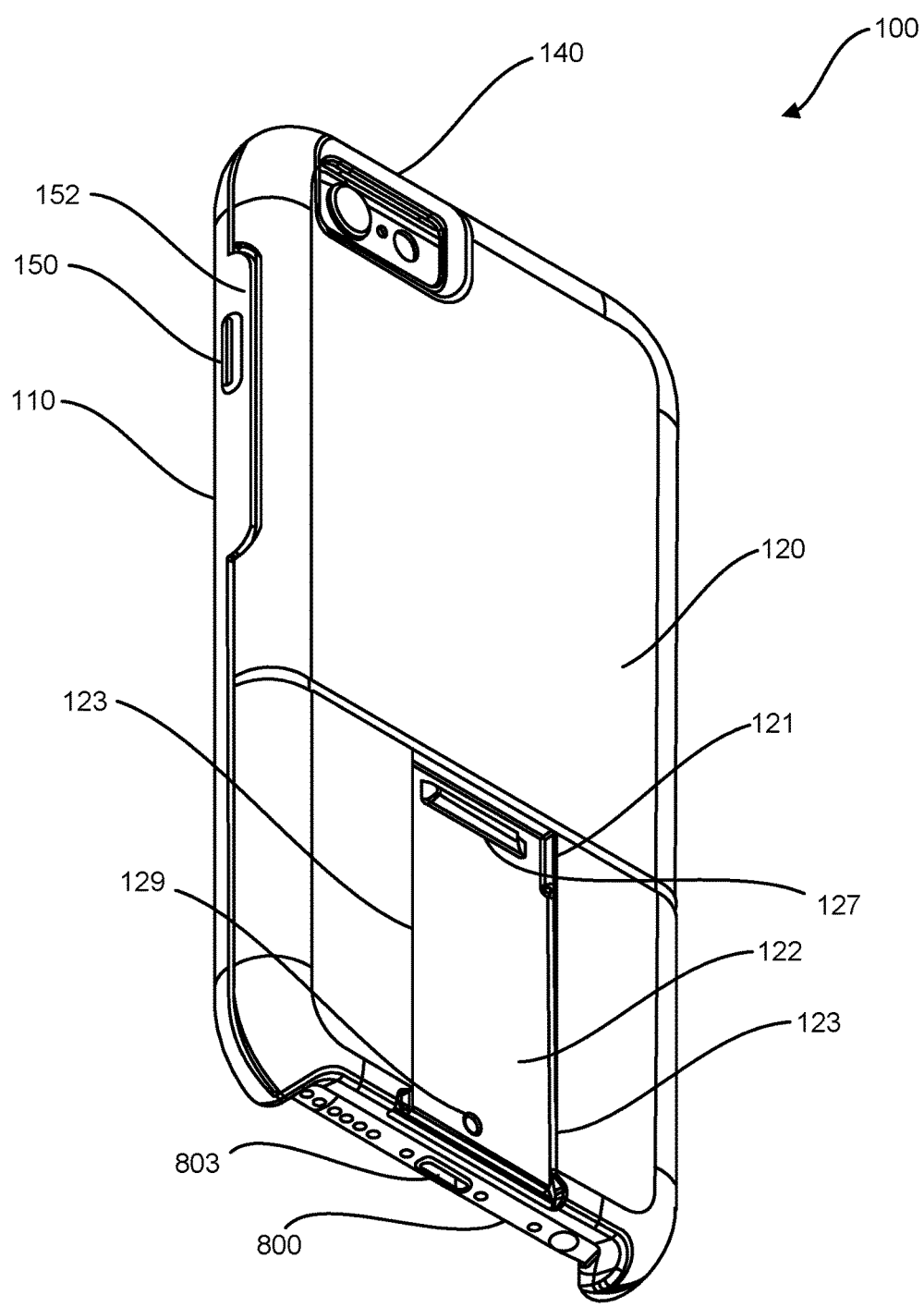
FIG. 4 illustrates another back perspective view of a protective case with an electronic device installed in one example of the invention.

FIG. 4 illustrates another back perspective view of protective case 100 with electronic device 800 installed and without accessory plate 900 attached. FIG. 4 illustrates another cutout area 152 on another side of protective case 100. A cutout area, such as cutout area 152 can be included on any combination of side of protective case 100. Protective case 100 also includes button pad 150. Many combinations of button pads and apertures, or no buttons or apertures at all, are possible depending on the particular locations of buttons, control features, switches, interfaces, and other features of any particular electronic device 800.

Features of protective case 100 for attaching an accessory, such as accessory plate 900, are also illustrated in FIG. 4. Attachment mechanism 121 collectively includes a variety of features or elements that may, in various combinations, be used to attach and retain an accessory to protective case 100. In the example of FIG. 4, attachment mechanism 121 includes receiver channel 122, lips 123, snap feature 127, and snap feature 129. Receiver channel 122 may include one or more slots, grooves, channels, tracks, rails, or other receiving features or areas for mechanically engaging and removably retaining an accessory. In the example of FIG. 4, receiver channel 122 is implemented in the form of a dovetail shaped slot into which an accessory slides. Receiver channel 122 includes lips 123 that bound or form the dovetail slot, retain the accessory, and allow it to be slid into attachment mechanism 121, and consequently into protective case 100, from one direction or along one axis while being retained or captured in other directions or in other axes. Other receiver channel shapes and configurations are possible.

In the example of FIG. 4, attachment mechanism 121 also includes snap feature 127 and snap feature 129. Snap feature 127 and snap feature 129 are for removably retaining or removably attaching an accessory to protective case 100. Although two snap features are illustrated, more or fewer snap features are possible. The snap features, individually or together, may have an interference fit with the accessory to removably retain the accessory in receiver channel 122 and/or may be configured such that they require overcoming an interference fit to insert or remove the accessory from receiver channel 122. The amount of interference and/or the characteristics of the snap features are selected such that the accessory does not accidentally dislodge from protective case 100 during normal use and handling, but also such that the accessory can be reasonably easily removed by a user when desired.

Snap feature 127 includes a ridge, bump, or protrusion that engages a corresponding snap feature, such as a groove, slot, or detent, of an accessory to removably retain the accessory in receiver channel 122. Snap feature 129 includes a ball, protrusion, detent, or recess that engages with a corresponding snap feature of the accessory to further removably retain the accessory in receiver channel 122. Other types, combinations, and numbers of snap feature are possible and the improvements disclosed herein are not to be limited to any type, combination, or number of snap features.

Figures 5A, 5B:
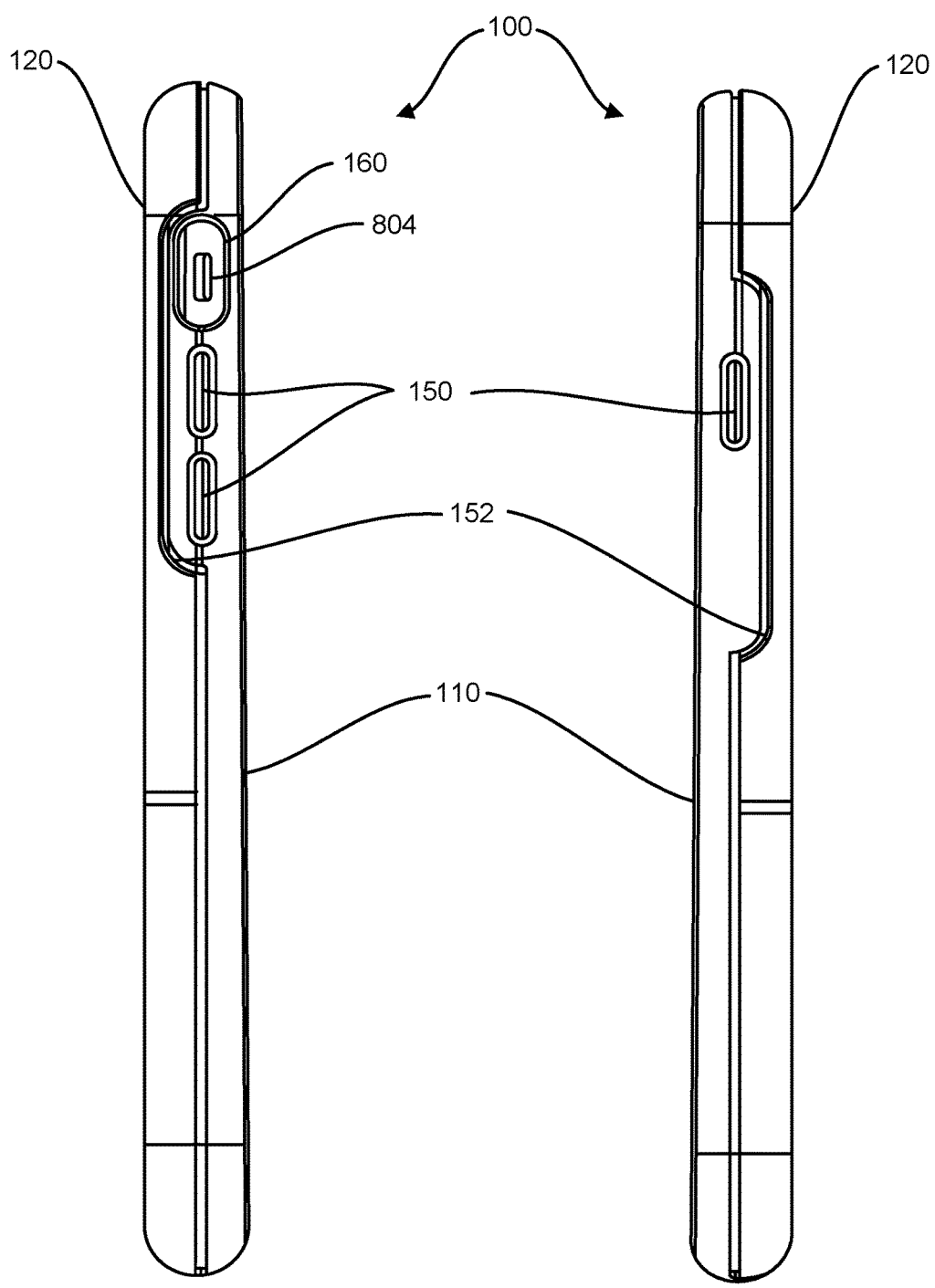
FIG. 5A illustrates a first side view of a protective case with an electronic device installed in one example of the invention.
FIG. 5B illustrates a second side view of a protective case with an electronic device installed in one example of the invention.

FIG. 5A illustrates a first side view of protective case 100 with electronic device 800 installed. A small portion of electronic device 800 is visible through aperture 160. FIG. 5B illustrates a second side view of protective case 100 with electronic device 800 installed.

Figure 6:
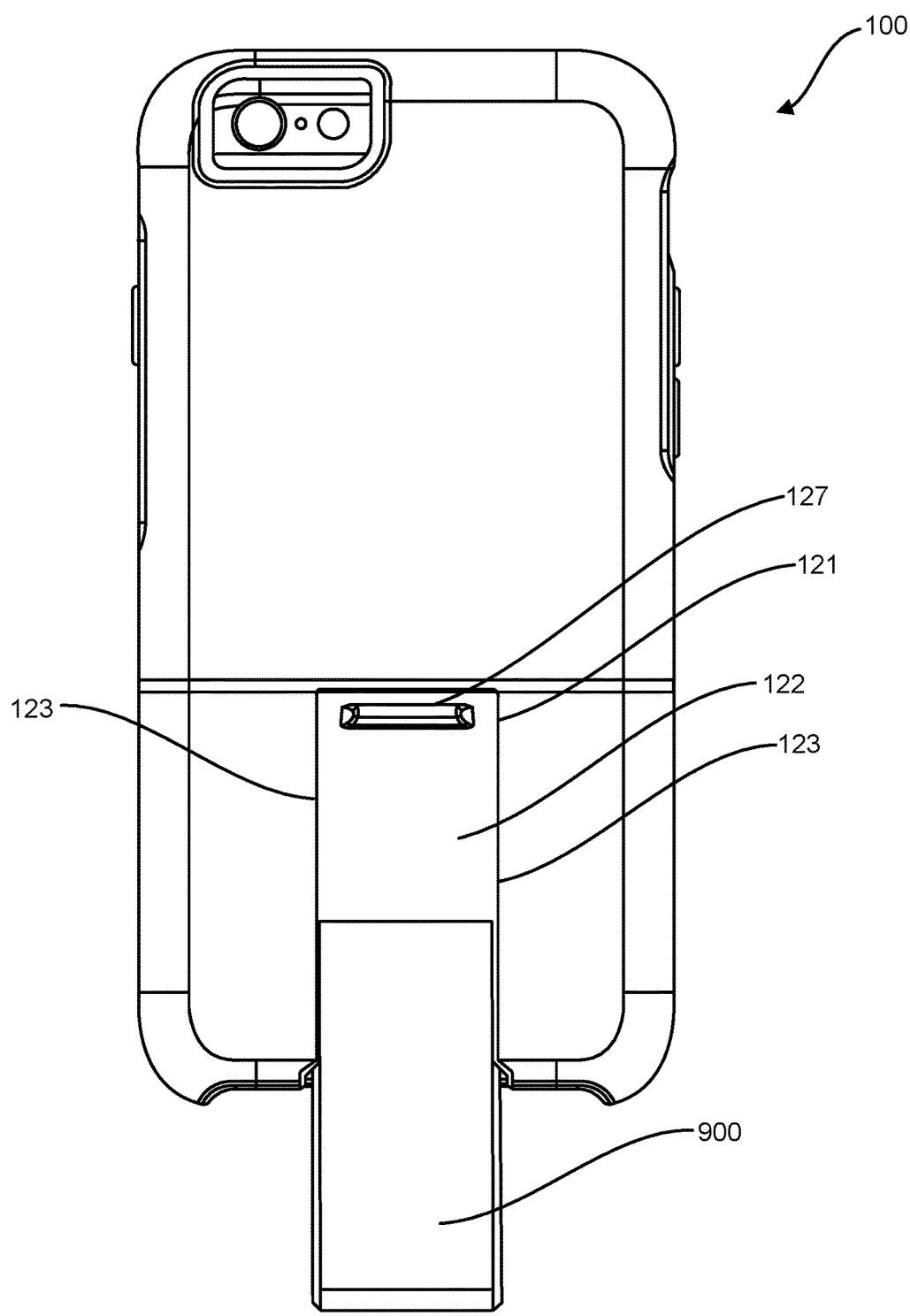
FIG. 6 illustrates a back view of a protective case with an accessory plate partially installed in one example of the invention.

FIG. 6 illustrates a back view of protective case 100 with accessory plate 900 partially installed. Accessory plate 900 slides out of the receiver channel 122 of attachment mechanism 122 of protective case 100 in a direction toward a bottom of the drawing sheet, relative to the orientation of FIG. 6. When fully inserted, accessory plate 900 is held in place by at least snap feature 127 and lips 123. While accessory plate 900 is illustrated as a plate having a similar size to receiver channel 122, a wide variety of accessories may include features similar to accessory plate 900 for attaching the accessories to protective case 100. The accessories may span a wide variety of features, functions, types, and sizes. An accessory may have the features of accessory plate 900 molded into or formed as part of the accessory to make the accessory compatible with attachment mechanism 121. Alternately, a plate, such as accessory plate 900, may be temporarily or permanently adhered to an accessory to make it compatible with attachment mechanism 121.

Figure 7:
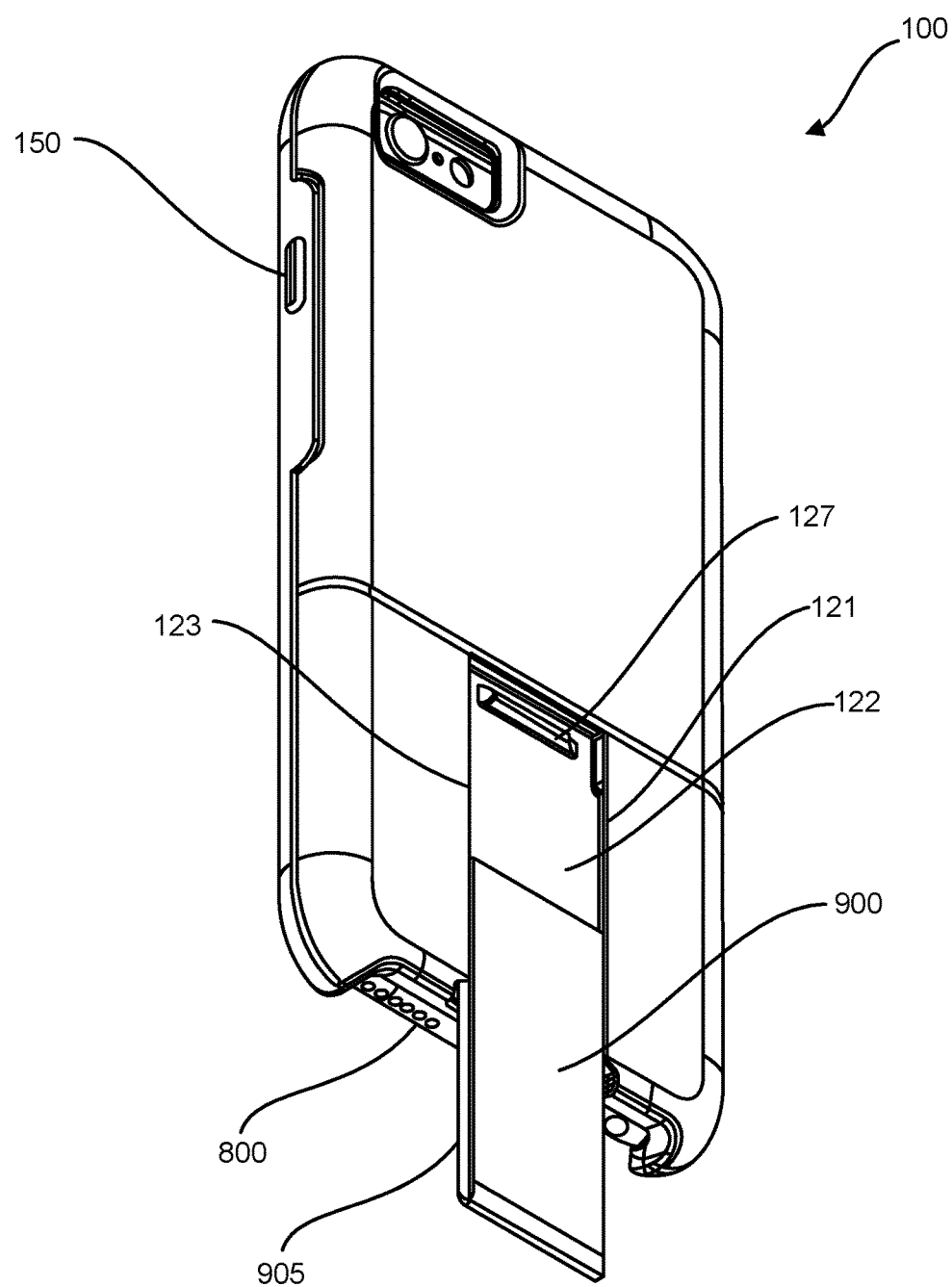
FIG. 7 illustrates a back perspective view of a protective case with an accessory plate partially installed in one example of the invention.

FIG. 7 illustrates a back perspective view of protective case 100 with accessory plate 900 partially installed. Accessory plate 900 includes an engagement feature 905 along at least a portion of its length to engage with lip 123 of receiver channel 122 to retain accessory plate 900 in receiver channel 122. Accessory plate 900 may include a similar engagement feature on an opposing side or edge of accessory plate 900 (not visible in FIG. 7). In one example, engagement features 905 may comprise a dovetail shape (when accessory 900 is viewed in cross-section) that corresponds to a dovetail shape formed by receiver channel 122 and lips 123 with sufficient clearance or gap such that accessory plate 900 slides into receiver channel 122 of protective case 100.

Figure 8A:
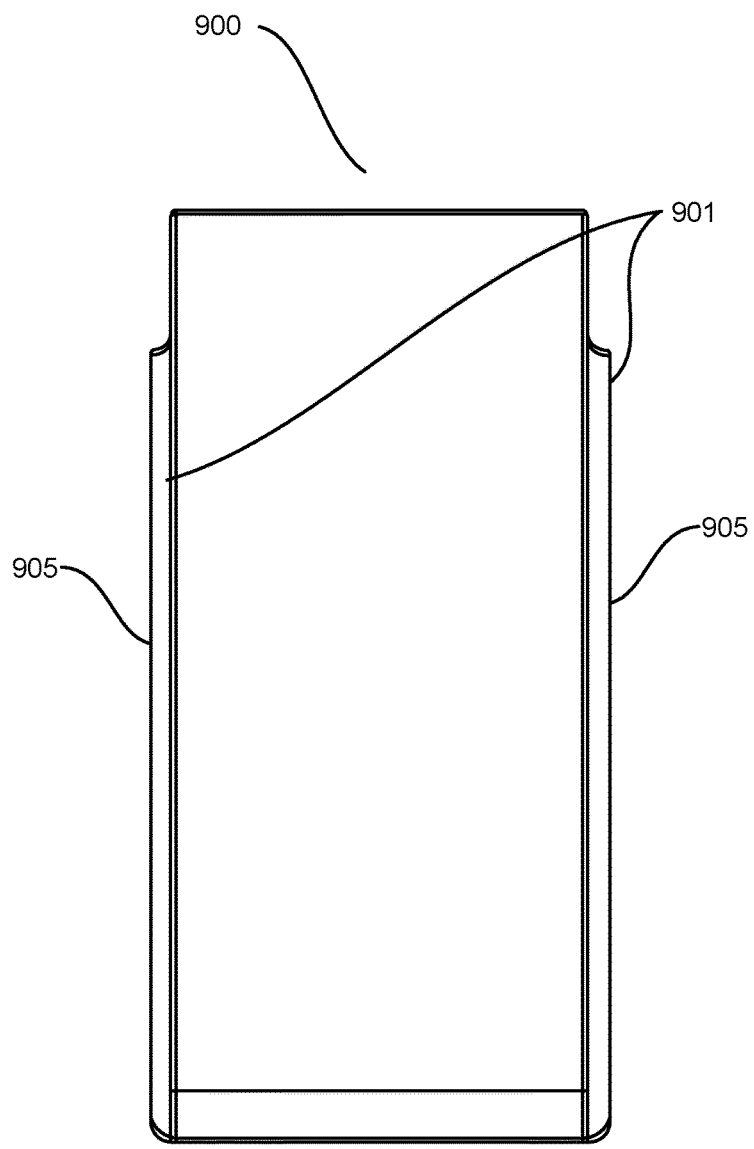
FIG. 8A illustrates an accessory plate for a protective case in one example of the invention.

FIG. 8A illustrates a front view of accessory plate 900. As discussed with respect to FIG. 7 and illustrated in various other figures, accessory plate 900 includes engagement features 905 to slidably retain accessory plate in another object, such as in receiver channel 122 of protective case 100. Engagement features 905 may form a dovetail shape. However, the improvements disclosed herein are not to be limited to engagement features, receiver channels, or slots of any particular shape or cross sectional characteristics. As illustrated, one or both of engagement features 905 need not necessarily extend a full length of accessory plate 900, although they may extend the full length in some embodiments. In some situations, engagement features 905 of accessory plate 900, or any other features that engage receiver channel 122, may be collectively referred to as a rail member (designated as 901 in FIG. 8A).

As discussed herein, many of the examples herein are illustrated with respect to accessory plate 900. However, the improvements disclosed herein are similarly applicable to various types of modules or accessories that have additional elements, functions, and or features and have engagement features similar to accessory plate 900 for engaging protective case 900. Accessory plate 900 is used in many of these examples for purposes of explaining the engagement features without being obscured by the other elements, functions, and features of the many potential accessories which may make use of the disclosed engagement features.

Figure 8B:
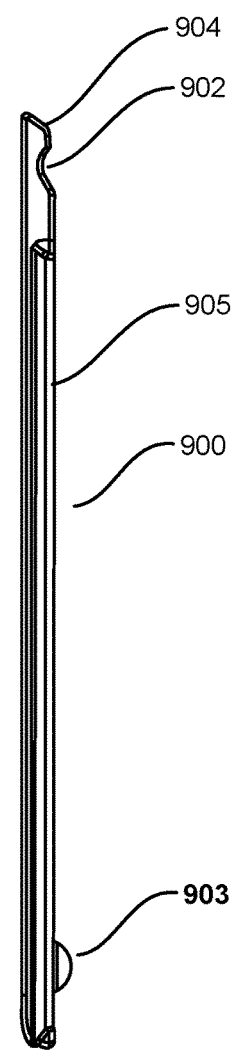
FIG. 8B illustrates a side view of accessory plate for a protective case in one example of the invention.

FIG. 8B illustrates a side view of accessory plate 900. Accessory plate 900 includes snap features 902 and 904 for engaging snap feature 127 of protective case 100 to removably retain accessory plate 900 in receiver channel 122 when accessory plate 900 is fully, or nearly fully, slid into receiver channel 122. In the example of FIG. 8B, snap feature 902 includes a groove, recess, cavity, and/or slot for engaging a ridge or protrusion that may comprise snap feature 127. Snap feature 904 comprises a lip, hook, and/or ridge adjacent to snap feature 902. Accessory plate 900 may also include features to assist a user in installing or removing accessory plate 900 from protective case 100, such as a slot or ridge for applying force using a fingernail.

Snap feature 902, snap feature 904, and/or snap feature 127 of protective case 100 may be arranged in a variety of ways to include any combination of one or more of a recess, a lip, a ridge, a hole, a slot, a groove, a cavity, a ball, a detent, a protrusion, and/or a hook to hold accessory plate 900 in place and cause resistance to the removal of accessory plate 900 from receiver channel 122. Sizes and shapes of snap features 902, 904, and 127 may be selected, varied, and/or positioned to accomplish varying levels of interference between the features. Varying the amount of interference between the features results in different amounts of force required to engage/disengage accessory plate 900.

In some situations, various accessories may be designed to have different levels of engagement/disengagement force with protective case 100 to accomplish different objectives. Accessories may be identified and/or marketed as having higher or lower levels of engagement/disengagement force. A higher engagement/disengagement force may be desirable for some accessories because these accessories are expected to be removed from the protective case infrequently. A higher engagement/disengagement force may also be desirable for some accessories because these accessories are larger or heavier and more susceptible to being accidentally disengaged due to handling, movement, dropping, or jarring. A higher engagement/disengagement force may also be desirable for some accessories due to user preference.

In other situations, a lower engagement/disengagement force may be desirable for some accessories because these accessories are expected to be attached to and removed from the protective case frequently. A lower engagement/disengagement force may also be desirable for some accessories because these accessories are smaller or lighter and less susceptible to being accidentally disengaged due to handling, movement, dropping, or jarring. A lower engagement/disengagement force may also be desirable for some accessories due to user preference.

In one specific example, a lip that comprises snap feature 904 may be increased in size to increase the engagement/disengagement force. In another example, a depth of a groove that comprises snap feature 902 may be increased to increase the engagement/disengagement force. In another example, a slope of the surface between snap feature 902 and snap feature 904 may be increased to increase the engagement/disengagement force. In another example, the lip that comprises snap feature 904 may be decreased in size, or removed altogether, to decrease the engagement/disengagement force. In another example, the depth of the groove that comprises snap feature 902 may be decreased to decrease the engagement/disengagement force. In another example, a slope of the surface between snap feature 902 and snap feature 904 may be decreased to decrease the engagement/disengagement force. Similarly, the size or shape of snap feature 127 may be changed to increase or decrease the engagement/disengagement force. Any combination of variations of the snap features described above may be used to increase or decrease the engagement/disengagement force for a particular accessory and protective case combination.

As illustrated in FIG. 8B, accessory plate 900 may also include snap feature 903. Snap feature 903 may comprise a ridge, a bump, a tab, a ball, and/or another protrusion for engaging another snap feature of protective case 100, such as snap feature 129 in receiver channel 122 of protective case 100. In one example, snap feature 903 comprises a ball-shaped protrusion that fits into a detent that comprises snap feature 129. The positioning and extent of protrusion of snap feature 903 relative to the sliding of engagement features 905 into receiver channel 122 is such that there is an interference fit that tends to force a protrusion into a detent when accessory plate 900 is slid into receiver channel 122 far enough for the ball-shaped protrusion to reach and drop into the detent. In some configurations, a detent and/or ball-shaped protrusion may not be included to reduce the possibility of lateral force and/or movement between the accessory and the case. This may be important, for example, if the accessory includes an electrical connection that will mate to a connector on the bottom of the electronic device. The detent and/or ball-shaped protrusion may tend to cause undesirable lateral movement of the accessory relative to the electronic as the electrical connectors are being mated and/or after the electrical connectors have been mated.

As accessory plate 900 is slid into receiver channel 122, snap feature 903 may not come into contact with the receiver channel 122 until the sliding insertion process is nearly complete since snap feature 903 is near an end of accessory plate 900. This may be beneficial because as snap feature 903 comes into contact with receiver channel 122 near the end of the sliding insertion process, snap feature 903 causes accessory plate 900 to be forced in a direction that is perpendicular, mostly perpendicular, or substantially perpendicular to receiver channel 122 due to dimensional interference between the components. The force on accessory plate 900 is counteracted by the force of lips 123 on engagement features 905 retaining accessory plate 900 in receiver channel 122. These counteracting interference forces are reduced, at least partially, when accessory plate 900 is slid far enough into the receiver channel such that snap feature 903 reaches and engages snap feature 129. The reduction in interference or force caused by the engagement of the snap features causes accessory plate 900 to tend to stay in place at that position and also necessitates that an external force to be applied by a user to remove accessory plate 900 from that position. Snap features 903 and 129 may accomplish these results alone, or in conjunction with similar characteristics or behaviors associated with snap feature interactions between snap features 902, 904, and/or 127.

As with snap features 902, 904, and 127, the sizes, dimensions, and/or shapes of snap features 903 and 129 may be selected to control the amount of force required to engage them and/or to overcome their engagement to control the magnitude of engagement/disengagement force required to attach/remove an accessory, such as accessory plate 900.

The dimensional interference associated with any of snap features, 127, 129, 902, 903, and/or 904 and the resulting force generated by them when accessory plate 900 is engaged, or in the process of engagement, may also serve another purpose in addition to keeping accessory plate 900 removably retained or engaged in receiver channel 122. As discussed herein, lips 123 of receiver channel 122 may retain accessory plate 900, including by engaging or applying force against engagement features 905 of accessory plate 900. In some examples, corresponding dovetail structures may be used to enable accessory plate 900 to slidably engage receiver channel 122. Engagement or sliding structures having other shapes are also possible.

While the components may be designed to have only a relatively small amount of clearance, play, or slop between them, some clearance, play, or slop may be necessary to accommodate manufacturing variations, to avoid situations where the components fit together too tightly, and/or to make it reasonably easy for a user to engage/detach the components. However, the clearance, play, or slop may be undesirable once the accessory is attached because it may permit the attached accessory to move slightly with respect to the protective case, rattle, and/or vibrate with respect to the protective case. Therefore, engagement of one or more of snap features, 127, 129, 902, 903, and/or 904 may be such that there is some remaining static force present between the accessory and protective case 100 in one or more directions to take up any remaining clearance, play, or slop and reduce the possibility of rattle, vibration, or other relative movement while the accessory is attached.

In one specific example, accessory plate 900 may have a dovetail engagement with receiver channel 123 and snap feature 903 may apply a force against accessory plate 900 in a direction away from receiver channel 122 even after snap feature 903 engages with snap feature 129. The force pushes accessory plate up against lips 123 in order to reduce or minimize rattling, minor movement, and/or undesired movement between the installed accessory plate 900 and protective case 100 that results from clearance, play, or slop between the two dovetail structures. Other snap features may be designed, positioned, and/or sized to accomplish similar objectives in place of, or in addition to, snap features 903 and 123.

In addition, the portions of accessory plate 900 and protective case 100 that slidably engage each other may include a taper, a draft, or a similar gradual variation in dimensions from one end to another, or from one location to another. One purpose of this taper, draft, or variation is to provide sufficient clearance, play, or slop to make it relatively easy for a user to get accessory plate 900 started in receiver channel 122, but also remove some of the clearance, play, or slop as accessory plate 900 is slid further into receiver channel 122. In this way, accessory plate 900 is relatively easy to get started into receiver channel 122 but also reduces the clearance, play, or slop as it is inserted further to provide a better fit. In some situations, the taper or draft may not extend the full length of the accessory plate or the receiver channel. This technique may be used alone or in conjunction with the other techniques described herein for reducing the clearance, play, or slop.

In one example, accessory plate 900 and receiver channel 122 each have a draft. The draft is such that accessory plate 900 has a cross sectional size at the end near snap feature 904 that is smaller than a cross sectional size at the end near snap feature 903. Receiver channel 122 may have a similar, corresponding draft. The draft of receiver channel 122 is such that is has a cross sectional size at one end that is smaller than a cross sectional size at the other end. The end having the smaller cross section size corresponding to the end of accessory plate 900 having the smaller cross sectional size.

In one specific example, the draft described above may have an angle of approximately 1.0 degrees relative to a centerline of accessory plate 900 such that one or both of engagement features 905 have an angle of 1.0 degrees relative to the centerline and/or to sides of accessory plate 900. In another specific example, the draft may be approximately 0.5 degrees. In another specific example, the draft may be approximately 1.5 degrees. In another specific example, the draft may be approximately 2.0 degrees. In another specific example, the draft may be approximately 2.5 degrees. In another specific example, the draft may be approximately 3.0 degrees. Other magnitudes of draft are possible. In some instances, the draft may be present in one dimension. In other instances, the draft may be present in two dimensions.

Figure 9:
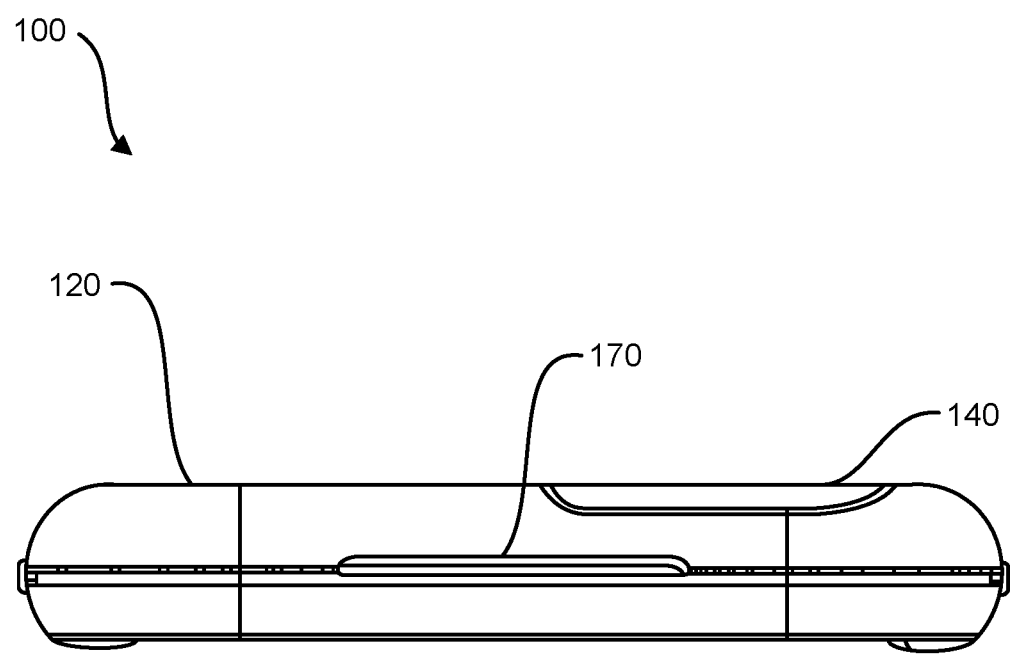
FIG. 9 illustrates a top view of a protective case in one example of the invention.

FIG. 9 illustrates a top view of protective case 100. The top of protective case 100 includes an anchor feature 170. Anchor feature 170 comprises a slot, groove, recess, or hole in one or more of outer shell 120 and inner liner 110 which may be used as an alternate, or additional, location in which an accessory can attach to, contact, anchor to, and/or grip protective case 100. Anchor feature 170 is discussed further with respect to FIGS. 12A and 12B.

Figures 10A, 10B:
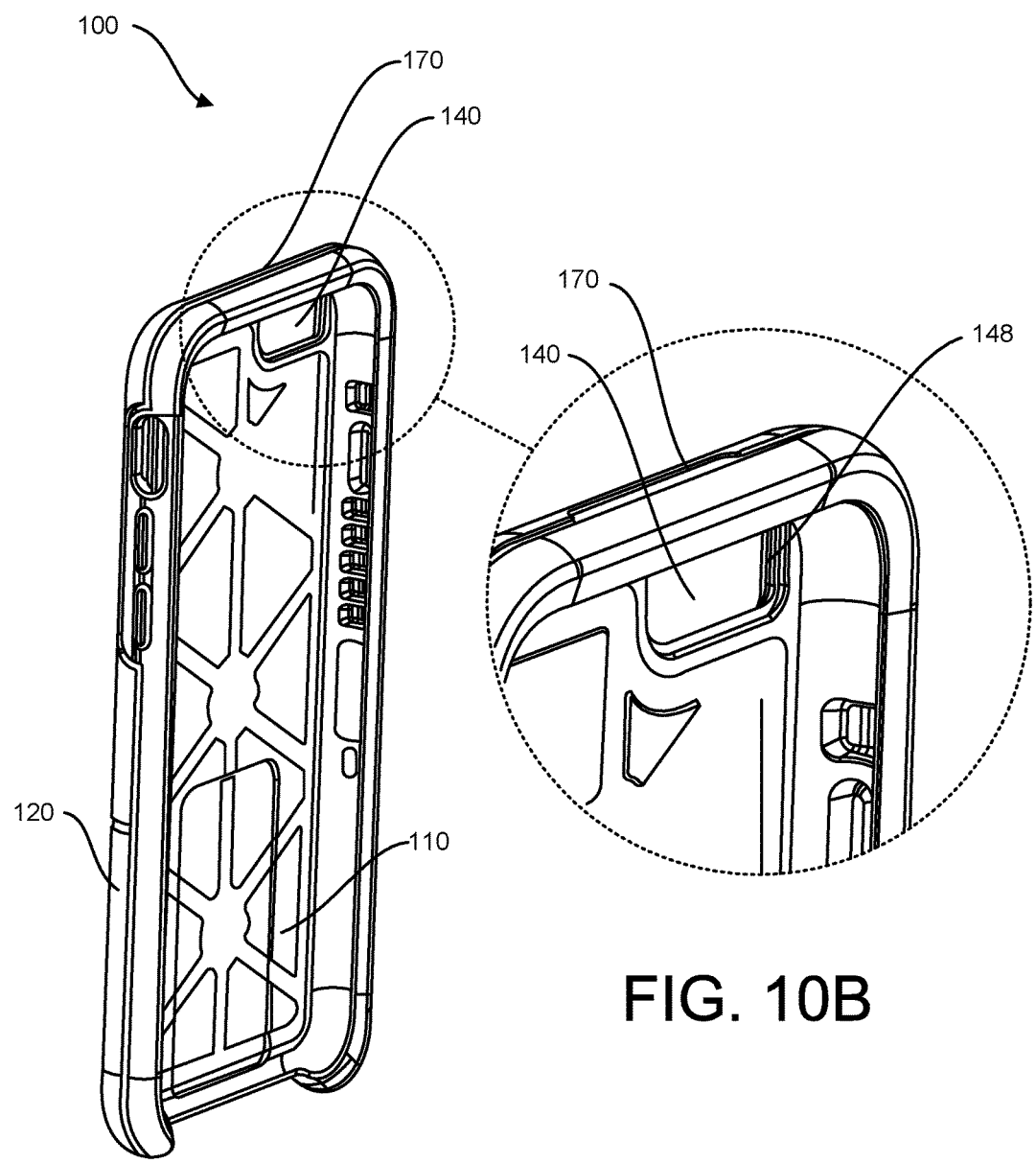
FIG. 10A illustrates a front perspective view of a protective case in one example of the invention.
FIG. 10B illustrates a detail view I of a corner of the protective case of FIG. 10A.

FIG. 10A illustrates a front perspective view of protective case 100. A detail view I of a portion of protective case 100 is identified in FIG. 10A. FIG. 10B illustrates detail view I. Detail view I illustrates an engagement feature 148 around at least a portion of a perimeter of aperture 140. Engagement feature 148 may include a lip, a ridge, a shoulder, a ledge, a shelf, a recess, and/or a cavity for attaching an accessory to protective case 100. In one example, the accessory may be a camera lens that attaches to the back of protective case 100 in a manner such that it is positioned over aperture 140 and over camera 802 of electronic device 800 when it is installed in protective case 100. In a further example, a lens accessory attached to protective case 100 may also include storage locations for one or more additional lenses or other objects.

Engagement feature 148 may include a lip on an inside edge of one or more portions of aperture 140 such that one or more flexible fingers or walls of an accessory may snap into or onto the lip(s) to removably attach the accessory to protective case 100 in proximity to aperture 140. Engagement feature 148 may also include one or more other types of engagement features or clasping mechanisms for attaching an accessory to protective case 100.

An accessory may also attach to protective case 100 at two or more locations. Attaching at two locations may provide a more secure attachment and/or may reduce relative movement between different portions of the accessory and protective case 100. In one example, an accessory may attach to protective case at two of attachment mechanism 121, anchor feature 170, and engagement feature 148. In another example, an accessory may attach to all three of attachment mechanism 121, anchor feature 170, and engagement feature 148.

Figure 11A:
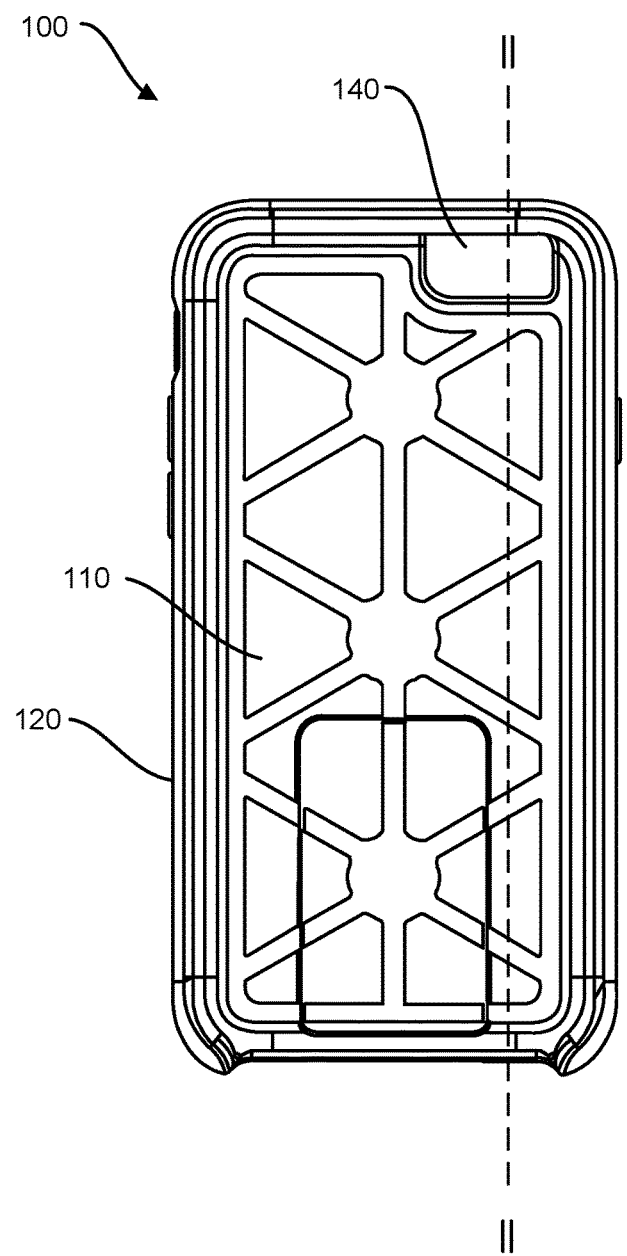
FIG. 11A illustrates a front view of a protective case in one example of the invention.
Figure 11B:
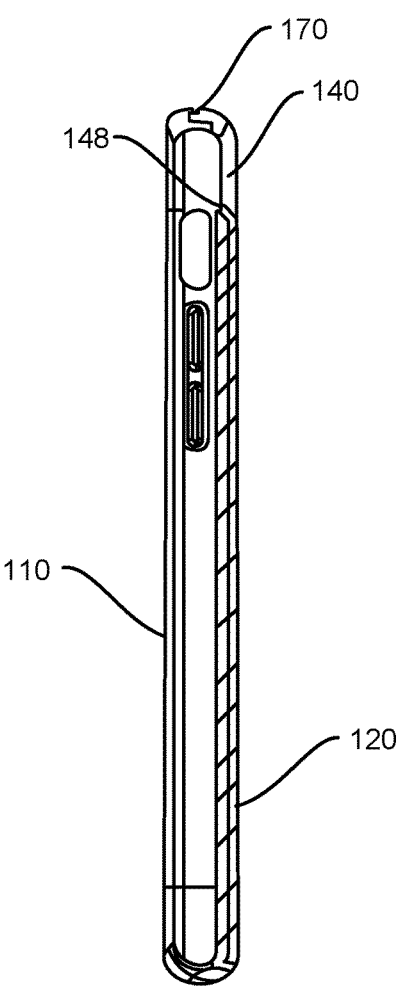
FIG. 11B illustrates a section view II-II of the protective case of FIG. 11A.

FIG. 11A illustrates a front view of protective case 100. A cross section view II is identified in FIG. 11A. FIG. 11B illustrates the cross section view II. FIG. 11B illustrates a cross section view of anchor feature 170. While anchor feature 170 is illustrated as having a square or rectangular cross sectional shape, other shapes are possible. In addition, anchor feature 170 is illustrated as a gap between outer shell 120 and inner liner 110. However, anchor feature 170 may be formed entirely in either outer shell 120 or inner liner 110. Anchor feature 170 may also be or include a snap feature or a fastener.

FIG. 11B also illustrates a cross sectional view of aperture 140 and engagement feature 148. In this example, engagement feature 148 comprises a lip that extends around at least a portion of aperture 140 such that an accessory can removably attach to protective case 100 by clipping onto, clipping into, snapping into, or otherwise engaging engagement feature 148 from outside of protective case 100 and through aperture 140.

Figure 17:
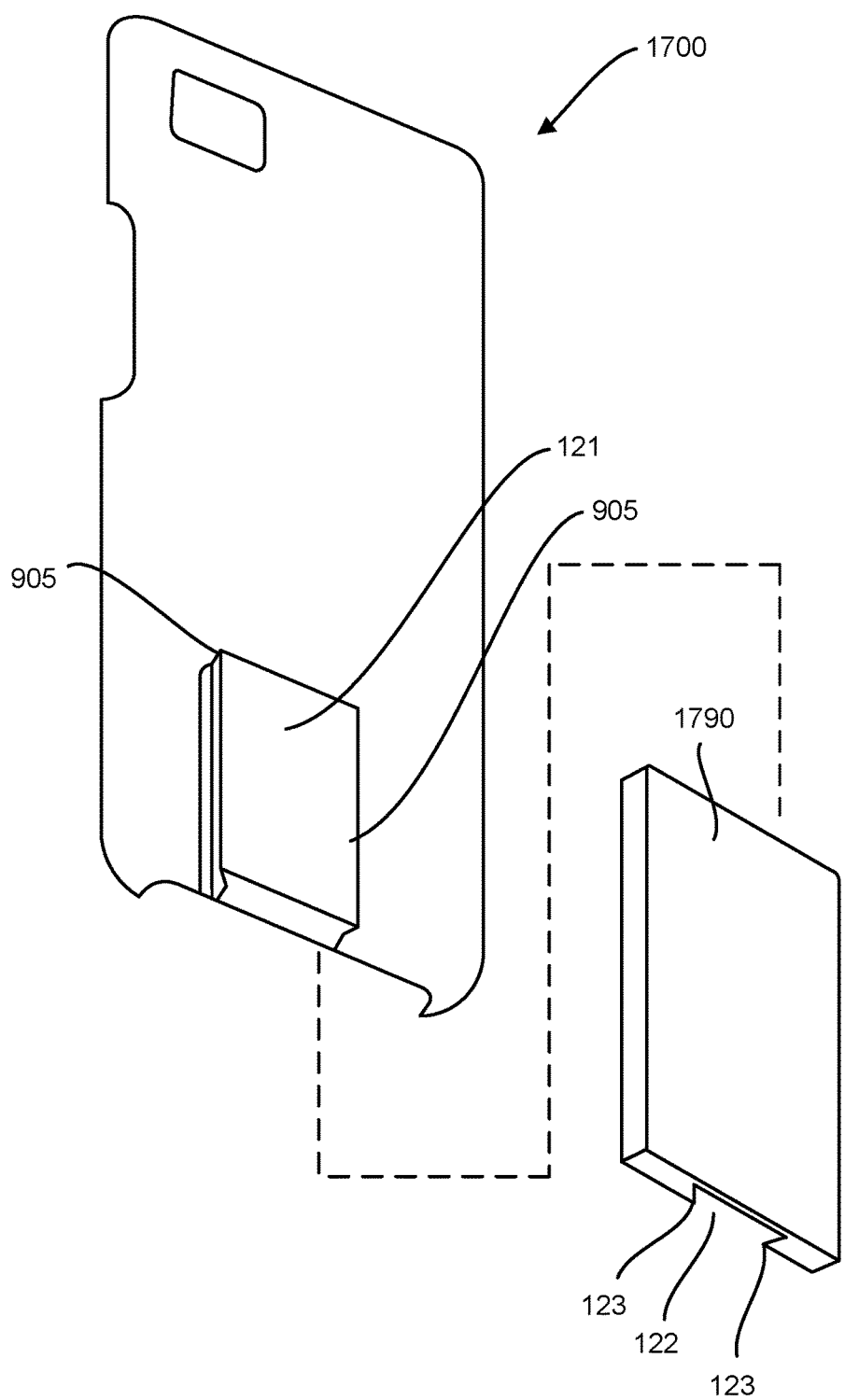
FIG. 17 illustrates an alternative example of a mounting accessory for use with a protective case.

From the foregoing, it should be appreciated that the disclosed version of attachment mechanism 121 includes female characteristics and accessory plate 900 includes male characteristics received in the female characteristics of attachment mechanism 121. In other examples of protective cases, however, as shown in FIG. 17, these characteristics could be reversed such that an accessory plate includes the female characteristics and attachment mechanism 121 includes the male characteristics. For example, FIG. 17 illustrate a protective case 1700 including attachment mechanism 121. Protective case 1700 may be an example of protective case 100 and may include any of the features, functions, characteristics, or elements of protective case 100. Accessory plate 1790 is an example of accessory plate 900 and may include any of the features, functions, characteristics, or elements of accessory plate 900.

So configured, accessory plate 1790 would include receiving channel 122, lips 123, and/or snap features 127, 129 (not shown in FIG. 17), while attachment mechanism 121 would include engagement features 905 and snap features 902, 903, and 904 (not shown in FIG. 17). Accordingly, in this alternative configuration, accessory plate 1790 would receive attachment mechanism 121.

Figure 18:
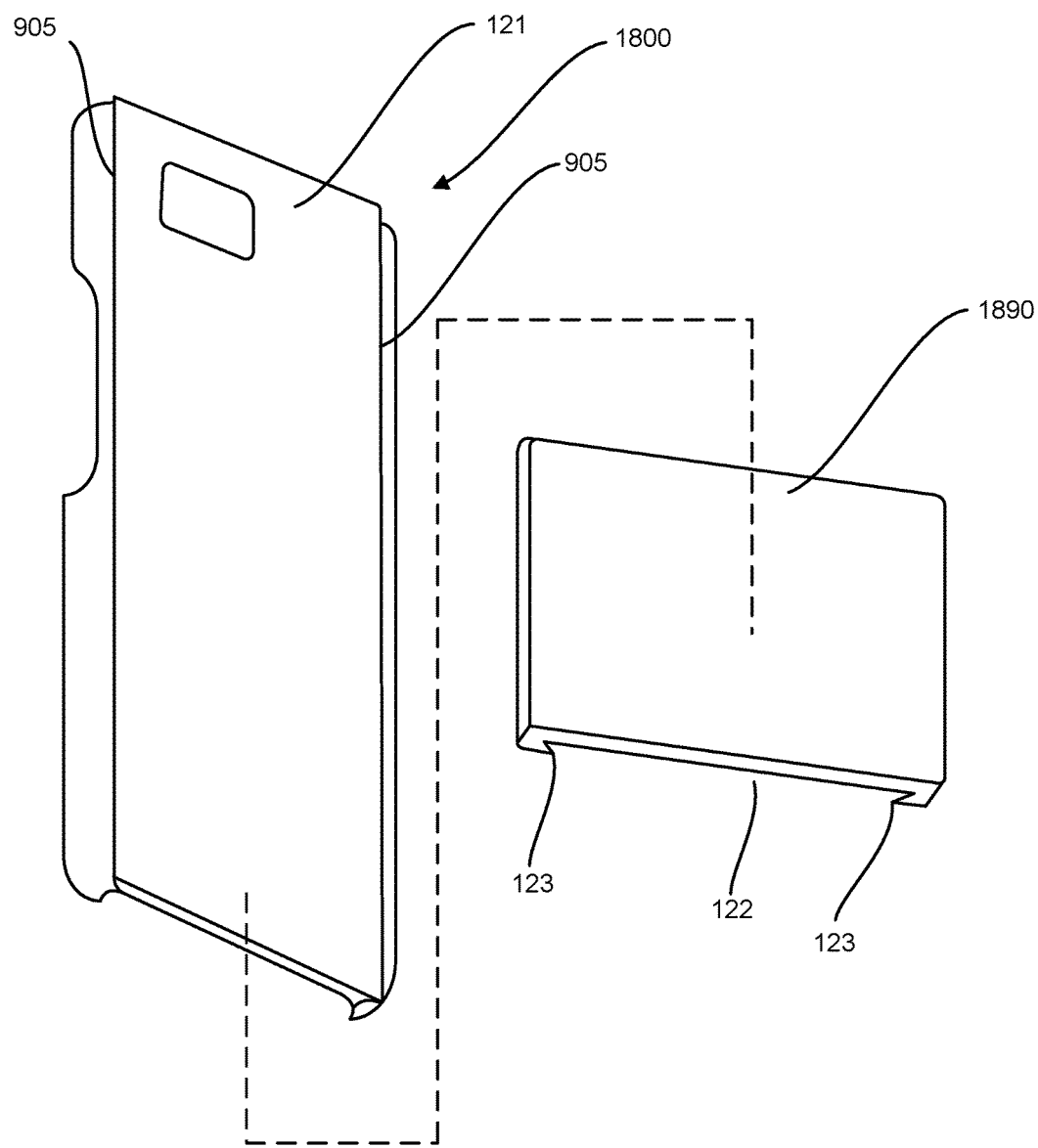
FIG. 18 illustrates yet another alternative example of a mounting accessory for use with a protective case.

While FIG. 17 illustrates the attachment mechanism 121 being narrower than the protective case 1700, in other examples, attachment mechanism 121 and accessory plate 1790 could have substantially the same width as the protective case 100, as illustrated for example, by the protective case 1800 and accessory plate 1890 in FIG. 18. Protective case 1800 may be an example of protective case 100 and may include any of the features, functions, characteristics, or elements of protective case 100. Accessory plate 1890 may be an example of accessory plate 900 and may include any of the features, functions, characteristics, or elements of accessory plate 900.

In still further examples, each of accessory plates and attachment mechanisms disclosed herein could include both female characteristics receiving corresponding male characteristics of the other. Such added structural interconnection could increase the integrity of the attachment between the accessory plate 1790 and attachment mechanism 121.

Figure 19:
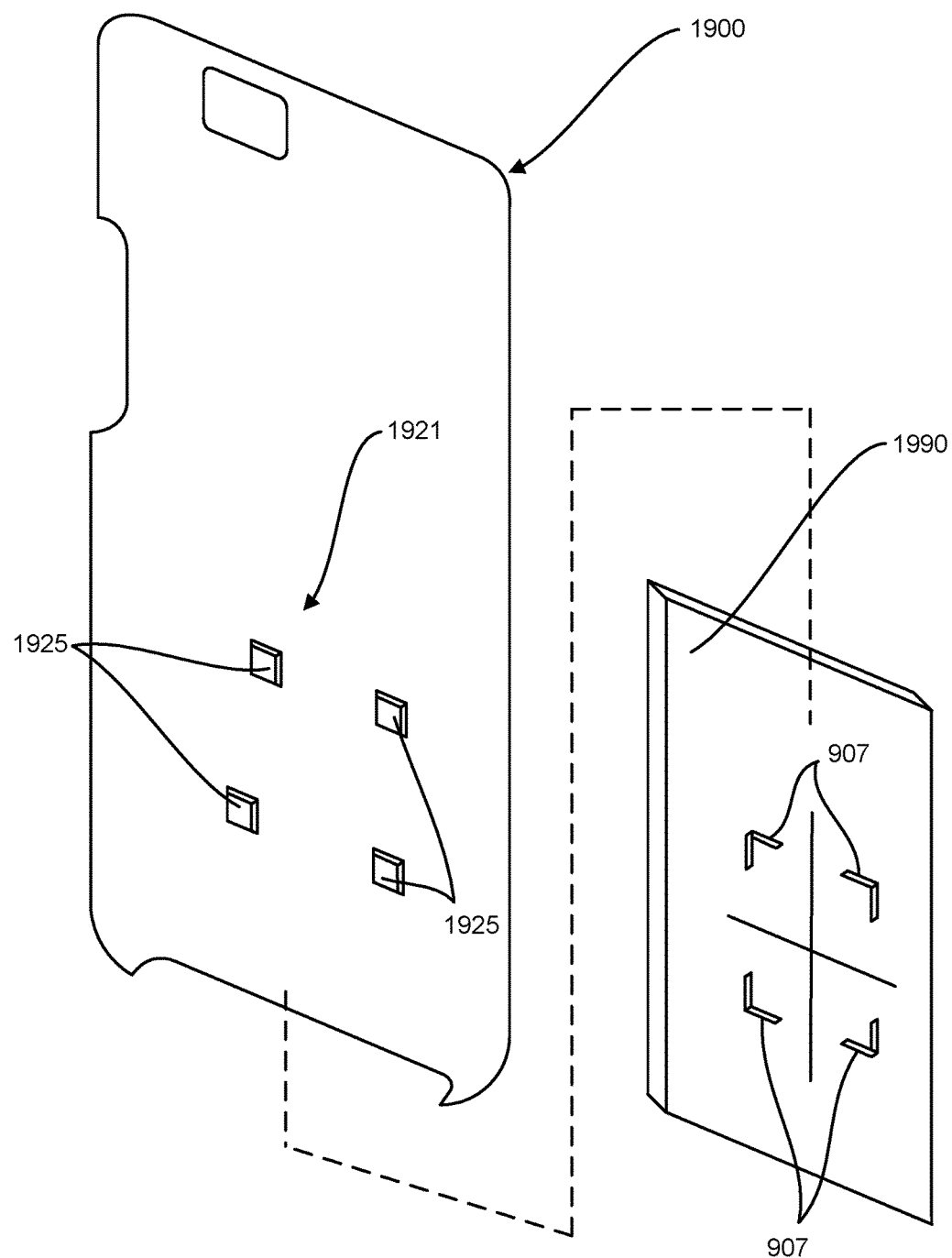
FIG. 19 illustrates yet another alternative example of a mounting accessory for use with a protective case.

Furthermore, while accessory plates and attachment mechanisms have thus far been disclosed as being attached by sliding the components linearly with respect to each other, other examples can be attached differently. For example, FIG. 19 illustrates another example of an attachment mechanism. Attachment mechanism 1921 includes a plurality of recesses 1925 and accessory plate 1990 including a plurality of locking lugs 907 to be inserted into the recesses 1925. Protective case 1900 may be an example of protective case 100 and may include any of the features, functions, characteristics, or elements of protective case 100. Accessory plate 1990 may be an example of accessory plate 900 and may include any of the features, functions, characteristics, or elements of accessory plate 900.

In FIG. 19, lugs 907 are or include L-shaped protrusions such that once lugs 907 are inserted into recesses 1925, accessory plate 1990 is rotated a short distance clockwise, for example, which creates a friction fit between lugs 907 and recesses 1925 to "lock" accessory plate 1990 into position. To ensure proper orientation of accessory plate 1990 relative to the remainder of case 1900 when installed, lugs 907 should be rotationally offset relative to recesses 1925 a same amount it takes to rotate and lock accessory plate 1990 to attachment mechanism 1921. In one example, an angle α of the rotation and offset may be 10 degrees, or 15 degrees, or 20 degrees, or 25 degrees, but generally any angle is possible. Other structures for maintaining the locked position of accessory plate 1990 could also be implemented. And, in other examples, accessory plate 1990 could include recesses 1925 while attachment mechanism 1921 includes lugs 907 to achieve the same outcome.

Further still, while each of the foregoing embodiments of attachment mechanisms and accessory plates are described as attaching to each other through purely mechanical means, alternative examples could utilize magnetic coupling elements either as a supplement to, or as a replacement for, one or more of the mechanical means.

Further still yet, it can be appreciated that each of the foregoing embodiments of attachment mechanisms and accessory plates generally possess a single mounting orientation relative to the protective case. This can be advantageous for applications where structural integrity is important. But for many applications, it may be desirable to mount the attachment mechanisms and accessory plates together in a manner that provides some variability in their orientation relative to the protective case. As such, in some alternative examples, embodiments of the present disclosure may include an intervening component positioned between the outer shell of the protective case and the attachment mechanism/accessory plate to allow for adjustments in relative orientation. Some possible intervening components could include a rotatably adjustable disc assembly, a linearly adjustable rack and pinion mechanism, or some other means. This could provide a user with the ability to manipulate the position of the electronic device and/or accessory relative to the viewing perspective of the user which may be desirable in applications where the electronic device is mounted to handle bars of a bicycle, the dashboard of a vehicle, etc. In some embodiments, such an adjustment mechanism may form part of the attachment mechanism and/or accessory plate instead of being an intervening component.

Figure 12A:
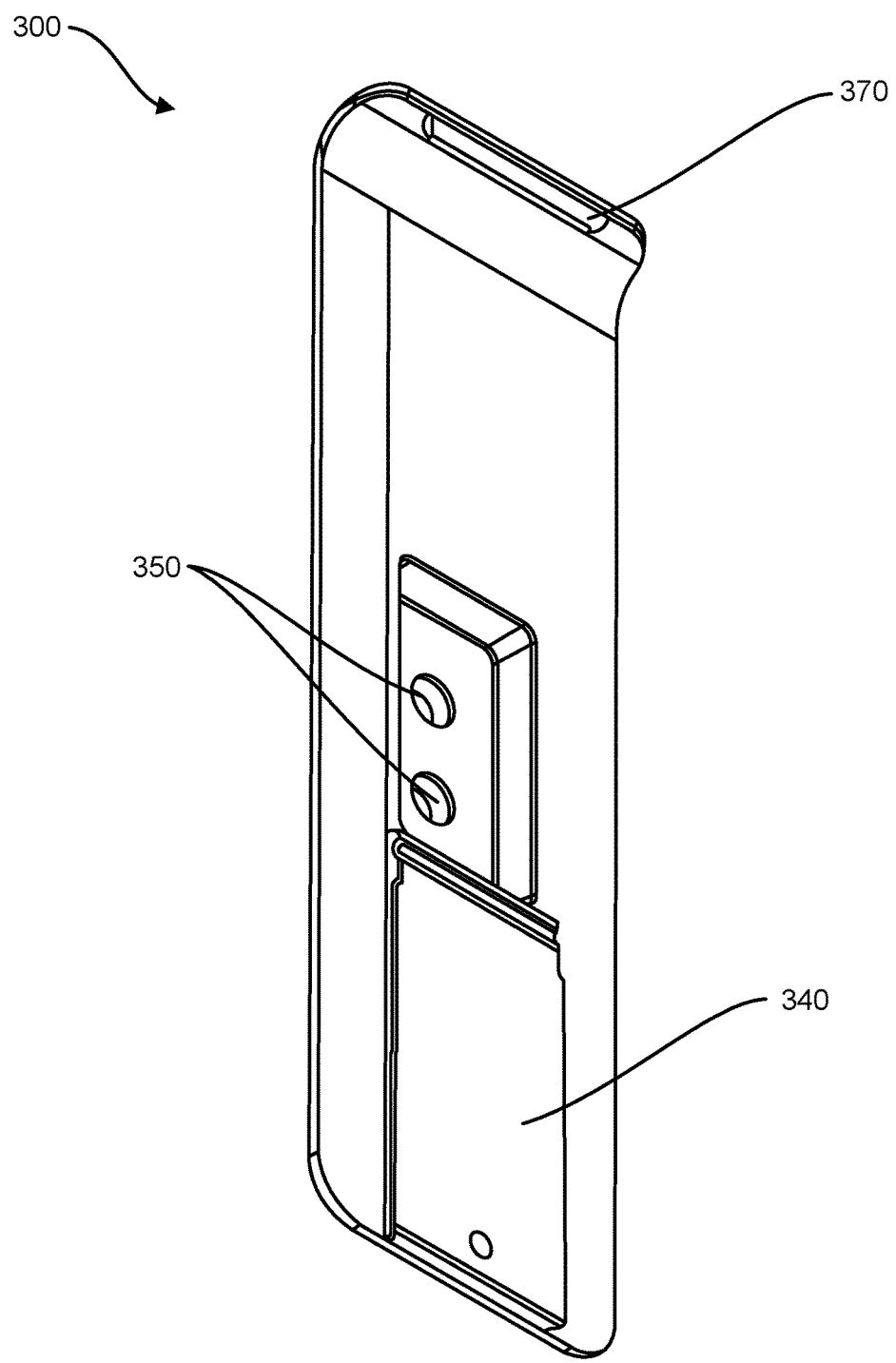
FIG. 12A illustrates an example of a mounting accessory for use with a protective case.

FIG. 12A illustrates a mounting accessory 300 for use with protective case 100. Mounting accessory 300 may be used to removably mount protective case 100 to another object or surface, such as to handlebars of a bicycle, a motorcycle, an all-terrain vehicle, a chest strap, a head strap, a dashboard of an automobile or a boat, etc. Mounting accessory 300 is permanently or semi-permanently mounted to the other object or surface with screws, rivets, clamps, etc., using mounting holes 350. Protective case 100 can then be attached to and detached from mounting accessory 300 quickly and easily as needed. Mounting accessory 300 provides a solid, rugged mount to the object while still allowing protective case 100 to be quickly and easily removed. Many other mounting configurations and methods are possible and the improvements disclosed herein are not to be limited to any particular method of mounting accessory 300 to another object or surface.

Mounting accessory 300 includes engagement mechanism 340 that is configured to removably attach to attachment mechanism 121 of protective case 100 as described herein. Engagement mechanism 340 may include any or all of the features of accessory plate 900 and may attach to protective case 100 using any or all of the features and methods described above with respect to accessory plate 900. In some configurations, engagement mechanism 340 may be an accessory plate 900 which has been adhered to mounting accessory 300. In other configurations, engagement mechanism 340 may be formed on or as part of mounting accessory 300 through a molding process.

Mounting accessory 300 includes engagement feature 370 which is positioned and sized to snap into anchor feature 170 of protective case 100 when engagement mechanism 340 is fully inserted into receiver channel 122. Engagement feature 370 may include a lip, a ridge, a peg, a post, a protrusion, and/or other extended feature for engaging anchor feature 170. The combination of the two attachment points provides a more secure mounting solution which can prevent accidental disengagement, as well as reducing undesired movement between mounting accessory 300 and protective case 100. For example, if mounting accessory 300 is attached to handlebars of a bicycle, attachment of protective case 100 to mounting accessory 300 at only engagement mechanism 340 may leave the remainder of protective case 100 susceptible to vibration and bouncing over bumps or accidental dislodgement if something caught the top of protective case 100. Engagement at or near both ends provides a more secure attachment while making use of attachment mechanism 121 on protective case 100 that can also be used for attaching other types of accessories. Engagement feature 370 in the version depicted in FIG. 12A is a static feature but in other embodiments, engagement feature 370 could include a movable mechanism for securing mounting accessory 300 to the anchor feature 170 of protective case 100. For example, engagement feature 370 could include a cammed lever mechanism, a latching hook, a screw, or any other similar type of device.

Figure 12B:
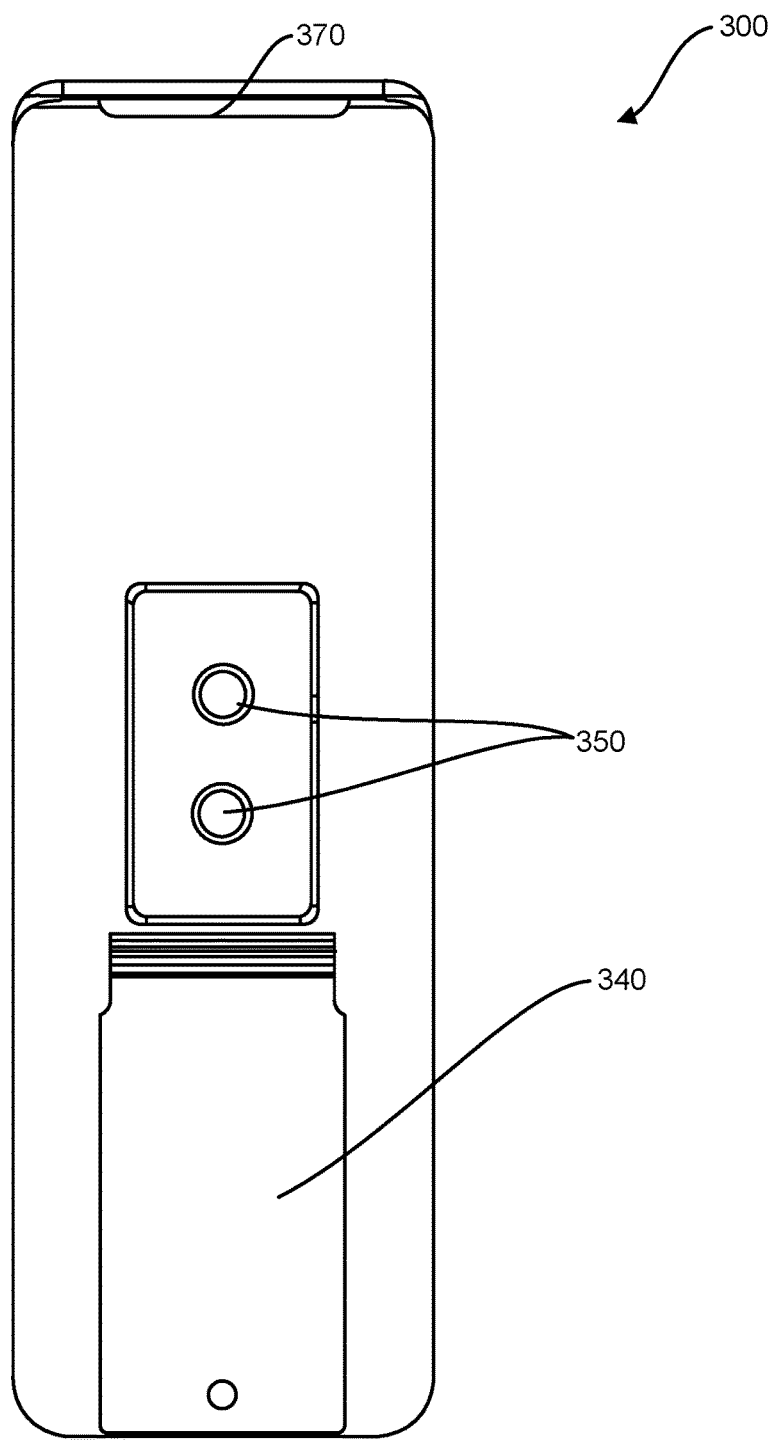
FIG. 12B illustrates an example of a mounting accessory for use with a protective case.

FIG. 12B illustrates a front view of mounting accessory 300. Attachment at multiple points can reduce or eliminate unwanted cantilevering effects of attaching at only a single location, or at multiple locations in a single area.

Figure 13:
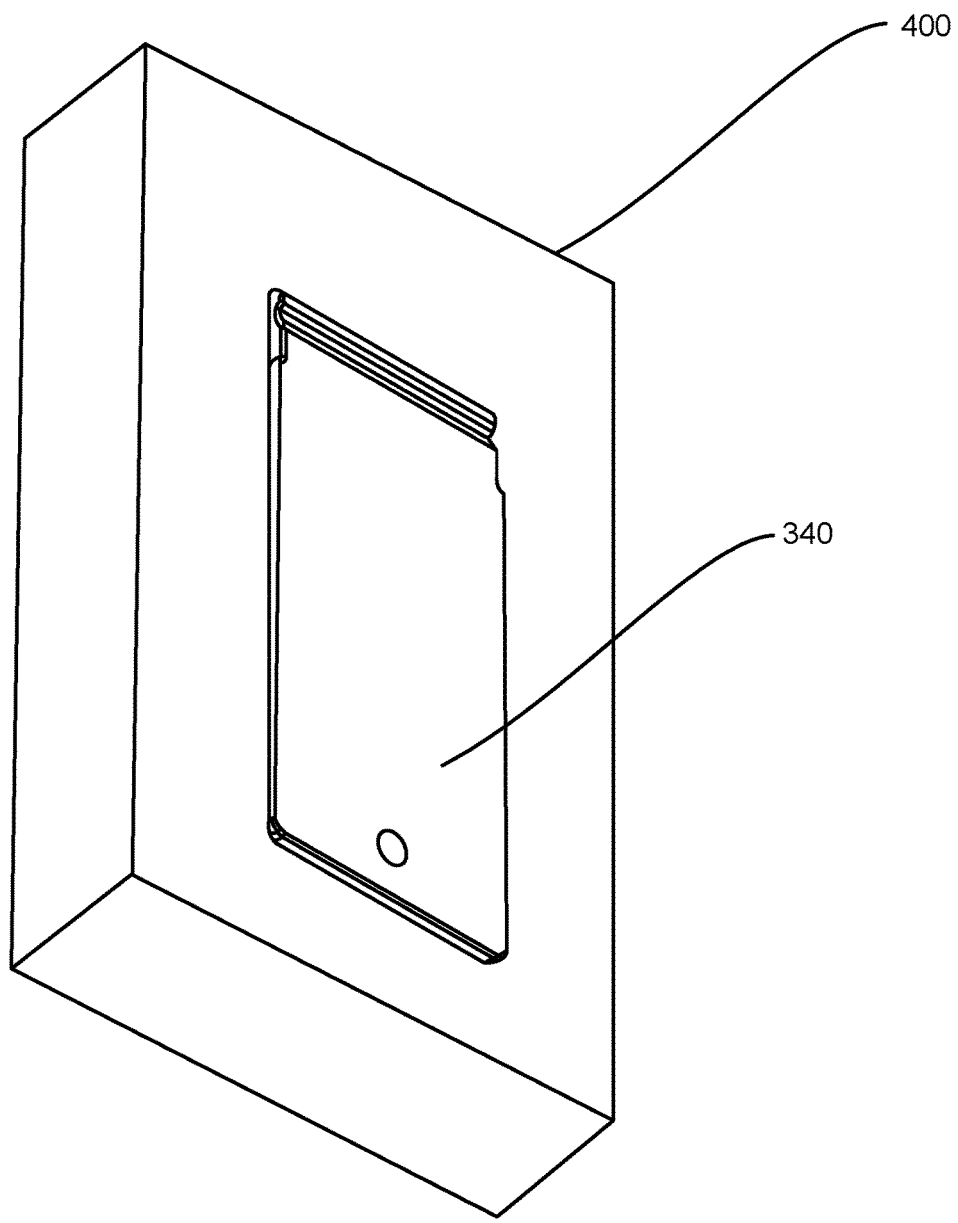
FIG. 13 illustrates an accessory for use with a protective case.

FIG. 13 illustrates an accessory 400 for use with protective case 100. Accessory 400 includes engagement mechanism 340 for removably attaching accessory 400 to protective case 100. Engagement mechanism 340 may include any or all of the features of accessory plate 900 and may attach to protective case 100 using any or all of the features and methods described above with respect to accessory plate 900. As with mounting accessory 300, engagement mechanism 340 may be formed as part of accessory 400 or may be a separate component that is attached to or adhered to accessory 400. Accessory 400 may be a device that interacts with and/or operates with an electronic device installed in protective case 400 or it may be a device that does not interact with the electronic device and is simply convenient to have attached to protective case 100.

There are many examples of accessories which may be used in conjunction with the techniques disclosed herein and the techniques are not to be limited to any particular type of accessory. Some examples of accessories that may not necessarily interact with the electronic device include: an attachable compartment for storing items (such as a credit card, money, an identification card, a key, and/or headphones) a removable belt clip for the protective case, a movable prop or kickstand for supporting protective case 100 and electronic device 800 in a viewing position, a money clip, a mounting apparatus for mounting protective case 100 to another item, a clip for attaching protective case 100 to another item, an apparatus for managing or storing cables (such as headphone cables), a plate with a unique identifying characteristic (such as writing, a number, a unique color, and/or a specialized design).

Figure 14:
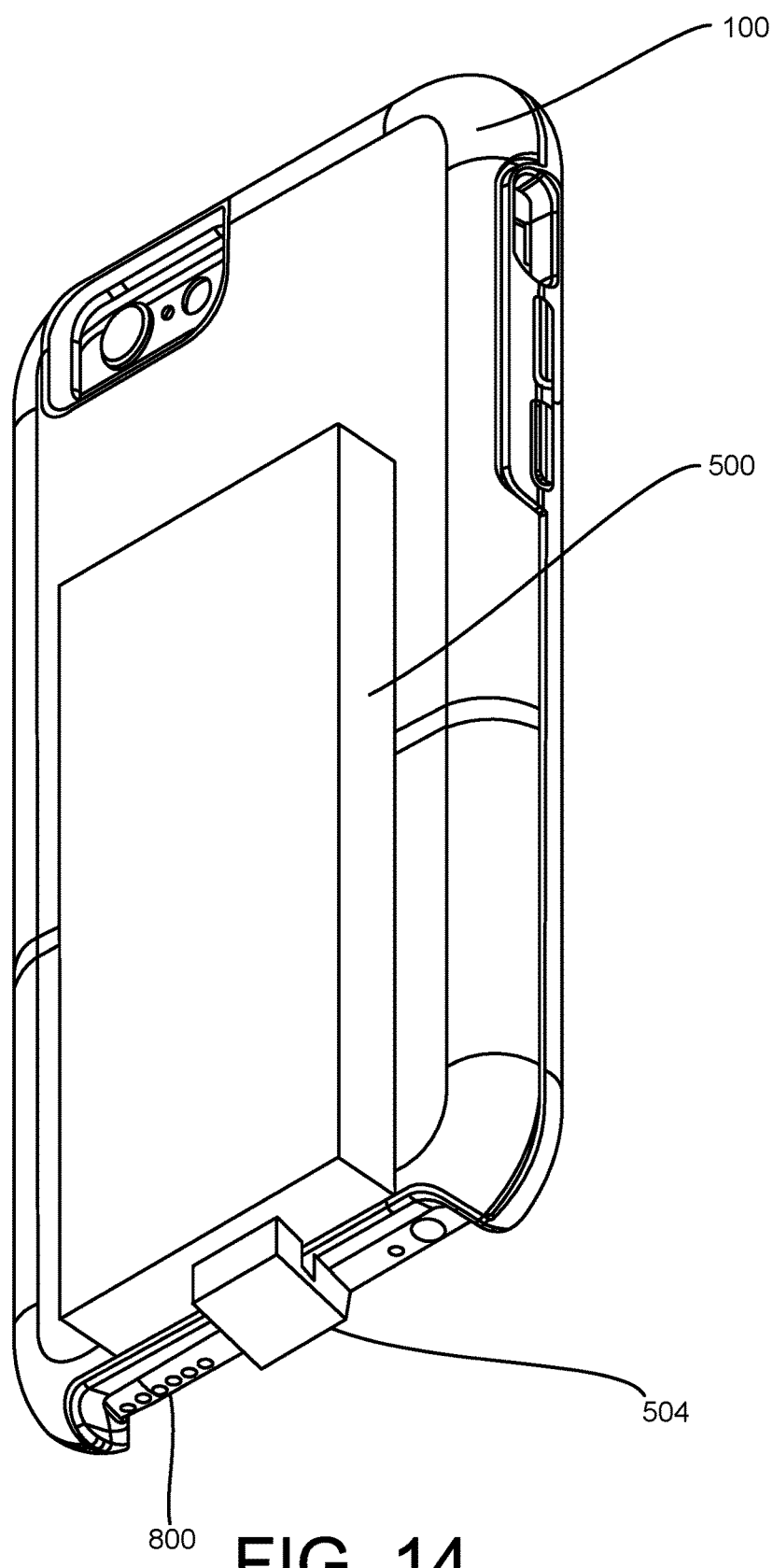
FIG. 14 illustrates an accessory for use with a protective case and an electronic device.

FIG. 14 illustrates accessory 500 for use with protective case 100 and installed electronic device 800. Accessory 500 includes engagement mechanism 340 (not shown) for at least partly removably attaching accessory 500 to protective case 100. Engagement mechanism 340 (not shown) may include any or all of the features of accessory plate 900 and may attach to protective case 100 using any or all of the features and methods described above with respect to accessory plate 900. Accessory 500 is further electrically interconnected to installed electronic device using electrical connector 504 which establishes an electrical interconnection between accessory 500 and electrical interface 803 of electronic device 800. The electrical connection may be used for communicating data and/or for transferring electrical power between accessory 500 and electronic device 800.

In one embodiment, electrical connector 504 is a separate component from accessory 500. Accessory 500 is configured such that when it is removably attached to protective case 100 an electrical interface of accessory 500 (not visible in FIG. 14) is positioned such that electrical connector 504 engages the electrical interface of accessory 500 and electrical interface 803 to electrically interconnect the two. Electrical connector 504 may also be described as an electrical adapter plug for interfacing an accessory, such as accessory 500, to an electronic device installed in protective case 100. In some situations, a single electrical adapter plug may be used with or compatible with multiple different accessories that may be attached to protective case 100.

In another embodiment, electrical connector 504 is permanently attached to accessory 500, semi-permanently attached to accessory 500, and/or is an integral part of accessory 500. In any of these situations, electrical connector 504 is positioned and oriented on accessory 500 such that when accessory 500 is fully engaged with attachment mechanism 121 and receiver channel 122 electrical connector 504 of accessory 500 engages electrical interface 803 of electronic device 800. In this way, accessory 500 is automatically, reliably, and conveniently electrically interconnected with electronic device 800 when accessory 500 is attached to protective case 100.

As illustrated in FIG. 14, an accessory may electrically interface to an installed electronic device through its primary electrical connector, such as an APPLE LIGHTNING® connector, a micro USB connector, a mini USB connector, or the like. In other configurations, an accessory may electrically interface to an installed electronic device through another electrical connector, such as through a headphone jack. For example, an accessory may physically attach to a protective case using one or more of the techniques disclosed herein and electrically interface to a headphone jack of an installed electronic device. The accessory may be designed to have dimensions and orientation such that when the accessory is attached to the protective case an electrical interface of the accessory engages with an electrical interface of the installed electronic device. Beneficially, attaching the accessory to the protective case also results in engagement of the electrical interfaces and the mechanical connection between the accessory and the protective case reduces or eliminates stress and strain on the electrical connections that may occur if no other mechanical connection between the accessory and the protective case was present. In some configurations, an accessory may electrically interface to more than one electrical interface of an installed electronic device.

In some configurations, an accessory attached to protective case 100 using the techniques disclosed herein may communicate with installed electronic device 800, and/or with other electronic devices, using wireless communication. For example, an accessory attached to protective case 100 may communicate with electronic device 800 or with electronics present on-board the protective case 100. Such communications may be uni-directional or bi-directional, direct or indirect (e.g., via a network), separate, multiple or concurrent, using a personal area network communications protocol (e.g., Bluetooth and/or Bluetooth Low Energy), a Near Field Communication (NFC) protocol, a Wireless Fidelity (e.g., Wi-Fi direct) protocol, a cellular communications protocol, a separate cellular communications protocol, an infrared communication protocol, and/or another type of wireless communication technique or protocol. In some situations, an accessory may interface to an electronic device through both a wired and a wireless connection, simultaneously or at alternate times. In some other situations, an accessory may interface with an electronic device through induction coils such as those implemented into wireless charging applications. The interface may involve transfer of electrical power, transfer or data communications, or both.

In some configurations, an accessory may communicate with, provide data to, receive data from, or otherwise interact with a software application (an app) running on one or more computer processors of the installed electronic device. The app may be included in software already installed on the electronic device, may be downloaded from a remote server over a network, and/or may be received by the electronic device from the accessory or from the protective case.

Some example of accessories that may electrically interconnect to an electronic device installed in protective case 100 or otherwise interact with the electronic device include: a camera accessory, a thermal imaging camera accessory, a sensor, an electronic measuring device, a stud finder, an audio device, a video device, a solar charger, a supplemental battery, a memory card reader/interface, a medical monitor, a medical measuring device, a medical monitoring device, a biometric sensor, a breathalyzer, a game controller interface, a light source, a credit card reader, a bar code scanner, a wireless signal amplifier, a wireless signal booster, a kit of components, a wireless signal enhancer, and/or any other device or system that interacts with the electronic device through a wired and/or a wireless connection. An accessory which electrically interconnects to or interacts with an electronic device installed in a protective case may also have other features for interacting or connecting with other devices, through a wired and/or a wireless connection.

An accessory may also include a combination of electrical and mechanical functions and may include any combination of the electrical and mechanical features or functions described herein.

In some situations, an adapter or carrier may be used to adapt a module or accessory for use with protective case 100. In other words, the adapter may receive the accessory and the adapter may interface to protective case 100 using one or more of the techniques described herein. This approach may be useful when the accessory has not been designed or manufactured specifically to fit protective case 100 and/or when it may be desirable to use an accessory with a variety of cases or equipment that have different geometries and/or configurations. In this way, the accessory can be used with protective case 100 in the manners described herein without redesigning the accessory to fit protective case 100.

An adapter may designed to attach to protective case 100 using the techniques described herein and may include a receiving area or other mechanical interface for receiving and/or attaching the accessory to the adapter. The dimensions and geometry of the adapter may be chosen such that a connector of the accessory is in a preferred location relative to a connector of the installed device when the accessory is attached to the adapter and the adapter is attached to protective case 100. The accessory may attached to the adapter using any kind of fastener including: a snap, a clip, a screw, a bolt, a slot, adhesive, glue, and/or tape. The accessory may be attached to the adapter permanently or may be removable. In some configurations, the adapter may have a tray, recess, or slot fitted to the accessory to make it easier to properly position the accessory on the adapter.

Figure 15:
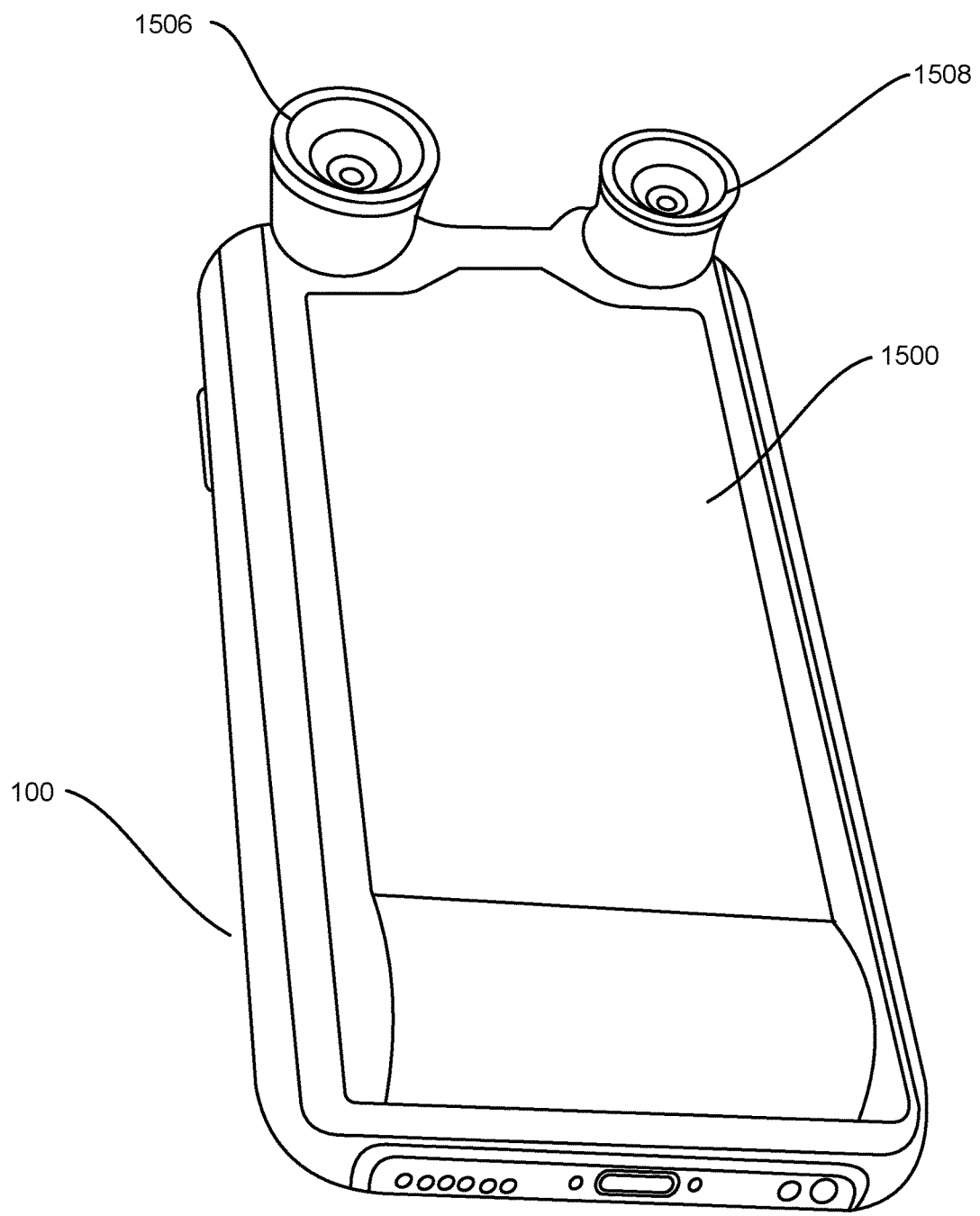
FIG. 15 illustrates an accessory removably attached to a protective case.

FIG. 15 illustrates an accessory 1500 removably attached to protective case 100. Accessory 1500 is an optical accessory for use with camera 802 of electronic device 800 which is installed in protective case 100 (but not visible in FIG. 15). Accessory 1500 is removably attached to protective case 100 using the techniques described herein. Accessory 1500 may be attached to protective case 100 at any combination of attachment mechanism 121, aperture 140, and/or anchor point 170. Accessory 1500 includes lens 1506 and lens 1508 which may have different optical characteristics. More or fewer lenses are possible. When attached, lens 1506 is positioned over aperture 140 such that it is at a proper location and a proper distance from electronic device 800 to be used with camera 802 of electronic device 800. Accessory 1500 also includes a storage location for lens 1508 such that lens 1508 is can be conveniently carried with the assembly and switched out for lens 1506 when desired.

Figure 16:
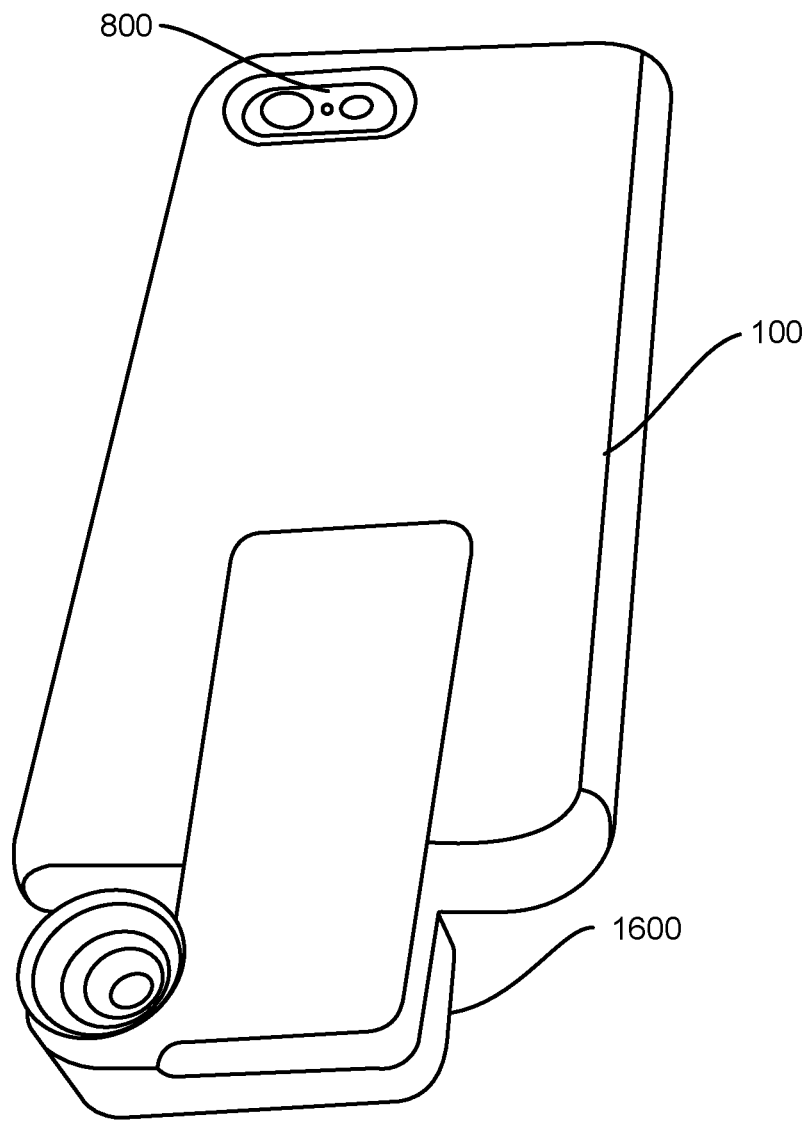
FIG. 16 illustrates an accessory removably attached to a protective case and electrically interfaced to an electronic device.

FIG. 16 illustrates an accessory 1600 removably attached to protective case 100 and electrically interfaced to electronic device 800 installed in protective case 100. Accessory 1600 includes an external or supplemental camera for use with electronic device 800. In one specific example, accessory may be a thermal imaging camera. Accessory 1600 is removably attached to protective case 100 using the techniques described herein. Accessory 1600 may be electrically interconnected to electronic device 800 at external electrical interface 803 of electronic device 800 using an electrical connector that is attached to or a part of accessory 1600 (but is not visible in FIG. 16). Alternately, accessory 1600 may communicate with electronic device 800 using a wireless connection. In addition, electronic device may execute a software application to facilitate operation of and interaction with accessory 1600 through a touchscreen and/or other user interface features of electronic device 800. In some examples, electronic device 800 may also provide electrical power to accessory 1600. In some examples, an accessory may have two electrical interfaces to electronic device 800.

Accessory plate 900, mounting accessory 300, accessory 400, accessory 500, accessory 1500, accessory 1600, and/or any other accessory or module used with the components described herein may include or be made of one or more of a variety materials including plastic, polymer, nylon, silicone, metal, ceramic, wood, or a combination thereof.

Further, any of these accessory or modules may have one or more selected surface finishes, colors, paint treatments, and/or coatings.

Various components described herein may be manufactured, provided, or sold in the form of a system or a kit. The system or kit may include any combination of: a protective case having an attachment mechanism having some or all of the features described herein, one or more accessories for attachment to the protective case, one or more electrical adapters for interfacing at least one of the accessories to an electronic device that fits in the protective case, and/or a software application for use with one or more of the accessories. The system or kit need not include every component and may not include one or more of the protective case, accessory, electrical adapter, and/or software application.

Many variations of components and techniques disclosed herein are possible. In one example, protective case 100 includes inner liner 110, outer shell 120, first aperture 130, and second aperture 140. Inner liner 110 receives and at least partially encloses electronic device 800. First aperture 130 permits access to touchscreen interface 801 of electronic device 800 when the electronic device 800 is installed in protective case 100. Second aperture 140 is in a back surface of protective case 100 and permits optical access to camera 802 of electronic device 800 while it is installed in protective case 100. Outer shell 120 includes attachment mechanism 121 for attaching accessory 900 to protective case 100. Attachment mechanism 121 includes receiver channel 122 for slidably receiving rail member 901 of accessory 900 to removably attach accessory 900 to protective case 900. Receiver channel 122 includes a lip 123 for retaining rail member 901 in receiver channel 122. Attachment mechanism 121 also includes snap feature 127. Snap feature 127 has an interference fit with a corresponding snap feature 902 of rail member 901 of accessory 900 to removably lock rail member 901 into receiver channel 122 of outer shell 120 when rail member 901 is fully inserted into receiver channel 122.

In one variation, receiver channel 122 and lips 123 comprise a dovetail slot in outer shell 120.

In another variation, receiver channel 122 has a cross sectional size at a first end that differs from a cross sectional size of receiver channel 122 at a second end. In a further variation, this cross section variation may be a draft of the receiver channel.

In another variation, rail member 901 is insertable into receiver channel 122 from the first end and the cross sectional size at the first end is larger than the cross sectional size at the second end such that a clearance gap between receiver channel 122 and rail member 901 decreases as an increasing amount of rail member 901 is inserted into receiver channel 122.

In another variation, snap feature 127 is in receiver channel 122. In a further variation, snap feature 127 includes a ridge configured to rest in a groove of rail member 901.

In another variation, attachment mechanism 121 includes second snap feature 129 that has an interference fit with second corresponding snap feature 903 of rail member 901 to further removably lock rail member 901 into receiver channel 122 when rail member 901 is inserted into receiver channel 122.

In one variation, snap feature 127 and second snap feature 129 of attachment mechanism 121 are at or near opposing ends of receiver channel 122.

In another variation, second snap feature 129 includes at least one of a ball and a detent.

In another variation, snap feature 127 and/or second snap feature 129 is configured to apply force to the an accessory in a direction substantially perpendicular to receiver channel 122 to reduce rattling and/or movement of the accessory relative to protective case 100.

In another variation, second aperture 140 includes a second attachment mechanism 148. In a further variation, second attachment mechanism 148 includes an engagement feature extending around at least a portion of a perimeter of second aperture 140 for attaching a second accessory to protective case 100 proximate second aperture 140. In a further variation, engagement feature 133 includes one or more of a recess, a lip, a ridge, a hole, a slot, and a groove.

In some configurations, external electrical interface 803 of electronic device 800 is accessible when electronic device 800 is installed in protective case 100 and attachment mechanism 121 is positioned to enable the attached accessory to interface to external electrical interface 803 of electronic device 800 when the accessory is attached to protective case 100 at attachment mechanism 121.

In another configuration, protective case 100 includes an anchor point or anchor feature 170 on at least one side of protective case 100 for receiving and removably retaining an accessory or a portion of an accessory. The anchor point may include one or more of: a recess, a lip, a ridge, a hole, a slot, and a groove.

In one configuration, attachment mechanism 121 may be located on a bottom portion of protective case 100 while anchor point 170 is on a top portion of protective case 100.

In some configurations, protective case 100 includes a button pad 150 for actuating a button of installed electronic device 800 from an outer surface of protective case 100.

In other configurations, a side of outer shell 120 may include cutout area 152 in which a portion of inner liner 110 extends to an outer surface of outer shell 120. Button pad 150 may be formed in the portion of inner liner 110 that is in cutout area 152.

In another example protective case 100 includes a third aperture 160 in a side of protective case 100 for accessing a switch or other feature of installed electronic device 800.

In yet another example, inner liner 110 may be comolded and/or co-formed with outer shell 120 or overmolded on outer shell 120. In some situations, inner liner c110 may include a material that is softer than a material of outer shell 120.

In another example, a modular case system for use with electronic device 800 is provided. The modular case system includes a protective case, such as protective case 100, and an accessory module that includes an interface similar to that of accessory plate 900.

In another example, a kit includes a protective case, such as protective case 100, and an accessory module that includes an interface similar to that of accessory plate 900.

In another example, a kit includes a protective case, such as protective case 100, and two or more accessory modules each including an interface similar to that of accessory plate 900.

In another example, an accessory is provided that includes an interface similar to the interface described with respect to accessory plate 900.

In yet another example, a kit includes two or more accessories each including an interface similar to that of accessory plate 900.

Using the techniques disclosed herein, a user may beneficially remove an accessory from a protective case when it is not needed and may do so without removing the electronic device from the protective case. Removing the accessory provides several benefits including: the ability to easily switch to a different accessory, not having to carry around a module when it is not needed, the ability to let someone else use the accessory, and/or the ability to remove the accessory for charging while still using the protective case/electronic device. A system with a standard interface allows a wide variety of accessories to be interchangeable and/or manufactured or supplied by a number of providers.

In some examples, any of the cases described herein may be used with or without a removable module attached. Beneficially, a user may attach a module only when needed. In other examples, two or more removable modules may be simultaneously attached to a single protective case.

In some examples, a removable module may be complementary to a function provided by the case. For example, a case may provide supplementary battery power to the electronic device while a removable battery module also contains a battery and provides even more supplementary power to the case and/or to the electronic device. Further, the removable battery module can be removed and temporarily replaced with a module having another functions such as, for example, a communication module supporting a communication protocol that differs from the electronic device, an infrared camera, or a biomedical monitor. Many other module functions are possible and the techniques disclosed herein are not to be limited to any particular type of module or module function.

In another example, the techniques disclosed herein may be implemented as a protective case for an electronic device having a touchscreen interface, a camera, and an external electrical interface, the protective case comprising: an inner liner for receiving and at least partially enclosing the electronic device; a first aperture in the protective case permitting access to the touchscreen interface of the electronic device when the electronic device is installed in the protective case; a second aperture in a back surface of the protective case permitting optical access to the camera of the installed electronic device; and an outer shell including an attachment mechanism for attaching an accessory to the protective case, the attachment mechanism including at least one of (a) and (b) as follows: (a) a receiver channel to slidably receive a rail member of the accessory to removably attach the accessory to the protective case, the receiver channel including a lip for retaining the rail member in the receiver channel, the attachment mechanism further including a snap feature, the snap feature having an interference fit with a corresponding snap feature of the rail member of the accessory to removably lock the rail member into the receiver channel of the outer shell when the rail member is inserted into the receiver channel, and (b) a rail member for sliding into a receiver channel of the accessory to removably attach the accessory to the protective case, the rail member including an engagement feature for retaining the rail member in the receiver channel, the attachment mechanism further including a snap feature, the snap feature having an interference fit with a corresponding snap feature of the receiver channel of the accessory to removably lock the rail member into the receiver channel when the rail member is inserted into the receiver channel.

Another example is a protective case of any of the examples herein where the receiver channel and the lip comprise a dovetail slot in the outer shell.

Another example is a protective case of any of the examples herein where the receiver channel has a cross sectional size at a first end of the receiver channel that differs from a cross sectional size of the receiver channel at a second end of the receiver channel.

Another example is a protective case of any of the examples herein where the rail member is insertable into the receiver channel from the first end and the cross sectional size at the first end is larger than the cross sectional size at the second end such that a clearance gap between the receiver channel and the rail member decreases as an increasing amount of the rail member is inserted into the receiver channel.

Another example is a protective case of any of the examples herein where the receiver channel includes a draft.

Another example is a protective case of any of the examples herein where the snap feature is in the receiver channel.

Another example is a protective case of any of the examples herein where the snap feature includes a ridge configured to rest in a groove of the rail member.

Another example is a protective case of any of the examples herein where the attachment mechanism includes a second snap feature, the second snap feature having an interference fit with a second corresponding snap feature of the rail member to further removably lock the rail member into the receiver channel when the rail member is inserted into the receiver channel.

Another example is a protective case of any of the examples herein where the snap feature and the second snap feature of the attachment mechanism are at opposing ends of the receiver channel.

Another example is a protective case of any of the examples herein where the second snap feature includes at least one of a ball and a detent.

Another example is a protective case of any of the examples herein where at least one of the snap feature and the second snap feature is configured to apply force to the attached accessory in a direction substantially perpendicular to the receiver channel to reduce rattling and/or movement of the attached accessory relative to the protective case.

Another example is a protective case of any of the examples herein where the second aperture includes a second attachment mechanism.

Another example is a protective case of any of the examples herein where the second attachment mechanism includes an engagement feature extending around at least a portion of a perimeter of the second aperture for attaching a second accessory to the protective case proximate the second aperture.

Another example is a protective case of any of the examples herein where the engagement feature includes one or more of a recess, a lip, a ridge, a hole, a slot, and a groove.

Another example is a protective case of any of the examples herein where the external electrical interface of the electronic device is accessible when the electronic device is installed in the protective case, the attachment mechanism positioned to enable the attached accessory to interface to the external electrical interface of the electronic device when the accessory is attached to the protective case at the attachment mechanism.

Another example is a protective case of any of the examples herein further including an anchor point on at least one side of the protective case for receiving and removably retaining a portion of the accessory.

Another example is a protective case of any of the examples herein where the anchor point includes one or more of a recess, a lip, a ridge, a hole, a slot, and a groove.

Another example is a protective case of any of the examples herein where the attachment mechanism is located on a bottom portion of the protective case and the anchor point is on a top portion of the protective case.

Another example is a protective case of any of the examples herein further comprising a button pad for actuating a button of the installed electronic device from an outer surface of the protective case.

Another example is a protective case of any of the examples herein where a side of the outer shell includes a cutout area in which a portion of the inner liner extends to an outer surface of the outer shell, and wherein the button pad is formed in the portion of the inner liner in the cutout area.

Another example is a protective case of any of the examples herein further comprising a third aperture in a side of the protective case for accessing a switch of the installed electronic device.

Another example is a protective case of any of the examples herein where the inner liner is comolded with the outer shell.

Another example is a protective case of any of the examples herein where the inner liner comprises a material that is softer than a material of the outer shell.

In yet another example, a modular case system for use with an electronic device having a touchscreen interface, a camera, and an external electrical interface comprises an accessory module for use with the electronic device, the accessory module having a rail member; and a protective case comprising: an inner liner for receiving and at least partially enclosing the electronic device; a first aperture permitting access to the touchscreen interface of the electronic device when the electronic device is installed in the protective case; a second aperture in a back surface of the protective case permitting optical access to the camera of the installed electronic device; and an outer shell including an attachment mechanism for attaching an accessory to the protective case, the attachment mechanism including at least one of (a) and (b) as follows: (a) a receiver channel to slidably receive a rail member of the accessory to removably attach the accessory to the protective case, the receiver channel including a lip for retaining the rail member in the receiver channel, the attachment mechanism further including a snap feature, the snap feature having an interference fit with a corresponding snap feature of the rail member of the accessory to removably lock the rail member into the receiver channel of the outer shell when the rail member is inserted into the receiver channel, and (b) a rail member for sliding into a receiver channel of the accessory to removably attach the accessory to the protective case, the rail member including an engagement feature for retaining the rail member in the receiver channel, the attachment mechanism further including a snap feature, the snap feature having an interference fit with a corresponding snap feature of the receiver channel of the accessory to removably lock the rail member into the receiver channel when the rail member is inserted into the receiver channel.

Another example is a modular case system of any of the examples herein where the receiver channel and the lip comprise a dovetail slot or a dovetail receiver in the outer shell.

Another example is a modular case system of any of the examples herein where the receiver channel has a cross sectional size at a first end of the receiver channel that differs from a cross sectional size of the receiver channel at a second end of the receiver channel.

Another example is a modular case system of any of the examples herein where the rail member is insertable into the receiver channel from the first end and the cross sectional size at the first end is larger than the cross sectional size at the second end such that a clearance gap between the receiver channel and the rail member decreases as an increasing amount of the rail member is inserted into the receiver channel.

Another example is a modular case system of any of the examples herein where the receiver channel includes a draft.

Another example is a modular case system of any of the examples herein where the snap feature is in the receiver channel.

Another example is a modular case system of any of the examples herein where the snap feature includes a ridge configured to rest in a groove of the rail member.

Another example is a modular case system of any of the examples herein where the attachment mechanism includes a second snap feature, the second snap feature having an interference fit with a second corresponding snap feature of the rail member to further removably lock the rail member into the receiver channel when the rail member is inserted into the receiver channel.

Another example is a modular case system of any of the examples herein where the snap feature and the second snap feature of the attachment mechanism are at opposing ends of the receiver channel.

Another example is a modular case system of any of the examples herein where the second snap feature includes at least one of a ball and a detent.

Another example is a modular case system of any of the examples herein where at least one of the snap feature and the second snap feature is configured to apply force to the attached accessory module in a direction substantially perpendicular to the receiver channel to reduce rattling and/or movement of the attached accessory module relative to the protective case.

Another example is a modular case system of any of the examples herein where the second aperture includes a second attachment mechanism.

Another example is a modular case system of any of the examples herein where the second attachment mechanism includes an engagement feature extending around at least a portion of a perimeter of the second aperture for attaching a second accessory module to the protective case proximate the second aperture.

Another example is a modular case system of any of the examples herein where the engagement feature includes one or more of a recess, a lip, a ridge, a hole, a slot, and a groove.

Another example is a modular case system of any of the examples herein where the external electrical interface of the electronic device is accessible when the electronic device is installed in the protective case, the attachment mechanism positioned to enable the attached accessory module to interface to the external electrical interface of the electronic device when the accessory module is attached to the protective case at the attachment mechanism.

Another example is a modular case system of any of the examples herein, the protective case further including an anchor point on at least one side of the protective case for receiving and removably retaining a portion of the accessory module.

Another example is a modular case system of any of the examples herein wherein the anchor point on the protective case includes one or more of a recess, a lip, a ridge, a hole, a slot, and a groove.

Another example is a modular case system of any of the examples herein where the attachment mechanism is located on a bottom portion of the protective case and the anchor point is on a top portion of the protective case.

Another example is a modular case system of any of the examples herein where the protective case further includes a button pad for actuating a button of the installed electronic device from an outer surface of the protective case.

Another example is a modular case system of any of the examples herein where a side of the outer shell includes a cutout area in which a portion of the inner liner extends to an outer surface of outer shell, and wherein the button pad is formed in the portion of the inner liner in the cutout area.

Another example is a modular case system of any of the examples herein further comprising a third aperture in a side of the protective case for accessing a switch of the installed electronic device.

Another example is a modular case system of any of the examples herein where the inner liner is comolded with the outer shell.

Another example is a modular case system of any of the examples herein wherein the inner liner comprises a material that is softer than a material of the outer shell.

In another example, an accessory module for use with a protective case for an electronic device having an external electrical interface comprises: a body member; and at least one of (a) and (b) as follows: (a) a rail member attached to the body member, the rail member having a dovetail shape and configured to slide into a corresponding dovetail receiver channel of the protective case for the electronic device to removably attach the accessory module to the protective case, the rail member including a snap feature having an interference fit with a corresponding snap feature of the dovetail receiver channel to removably lock the rail member into the dovetail receiver channel of the protective case when the dovetail rail member is inserted into the dovetail receiver channel, and (b) a dovetail receiver channel attached to the body member, the dovetail receiver channel having a dovetail shape and configured to receive a corresponding dovetail rail member of the protective case for the electronic device to removably attach the accessory module to the protective case, the rail member including a snap feature having an interference fit with a corresponding snap feature of the dovetail receiver channel to removably lock the rail member into the dovetail receiver channel when the dovetail rail member is inserted into the dovetail receiver channel.

Another example is an accessory module of any of the examples herein where the dovetail shape of the rail member includes a draft.

Another example is an accessory module of any of the examples herein wherein the snap feature includes a hook and a groove, and wherein the corresponding snap feature of the dovetail receiver channel of the protective case includes a ridge that engages with the groove.

Another example is an accessory module of any of the examples herein where the rail member includes a second snap feature, the second snap feature having an interference fit with a second corresponding snap feature of the dovetail receiver channel of the protective case to further removably lock the rail member into the dovetail receiver channel when the rail member is inserted into the dovetail receiver channel.

Another example is an accessory module of any of the examples herein where the snap feature and the second snap feature of the rail member are at opposing ends of the rail member.

Another example is an accessory module of any of the examples herein where the second snap feature includes at least one of a ball and a detent.

Another example is an accessory module of any of the examples herein where at least one of the snap feature and the second snap feature is configured to apply force against the receiver channel in a direction substantially perpendicular to rail member to reduce rattling and/or movement of the accessory module relative to the protective case.

Another example is an accessory module of any of the examples herein further comprising a secondary attachment mechanism for further removably attaching the accessory module to the protective case at an anchor point on the protective case.

Another example is an accessory module of any of the examples herein where the secondary attachment mechanism includes at least one of a lip and a ridge.

Another example is an accessory module of any of the examples herein where the anchor point includes one or more of a recess, a lip, a ridge, a hole, a slot, and a groove.

Another example is an accessory module of any of the examples herein further comprising a tertiary attachment mechanism for further removably attaching the accessory module to the protective case.

Another example is an accessory module of any of the examples herein further comprising an electrical connector position to mate with the external electrical interface of the electronic device when the electronic device is installed in the protective case and the accessory module is attached to the protective case.

Another example is an accessory module of any of the examples herein further comprising electrical components for exchanging electrical communications with the electronic device.

Another example is an accessory module of any of the examples herein where the accessory module includes a power storage device that supplies electrical power to the electronic device.

Another example is an accessory module of any of the examples herein where the body of the accessory module includes a mounting member for removably mounting the protective case to another object.

Another example is an accessory module of any of the examples herein where the body of the accessory module includes a storage feature or storage receptacle for storing one or more other objects.

Another example is an accessory module of any of the examples herein where the accessory module is a protective cover or a decorative cover for the dovetail receiver channel.

Another example is an accessory module of any of the examples herein where the storage feature includes a money clip.

Another example is an accessory module of any of the examples herein where the storage feature includes a storage compartment.

In another example, a protective case for an electronic device has a touchscreen interface, a camera, and an external electrical interface comprises: an inner liner for receiving and at least partially enclosing the electronic device; a first aperture in the protective case permitting access to the touchscreen interface of the electronic device when the electronic device is installed in the protective case; a second aperture in a back surface of the protective case permitting optical access to the camera of the installed electronic device; and an outer shell including an attachment mechanism formed in or on the outer shell for removably attaching an accessory to the protective case.

Another example is a protective case of any of the examples herein wherein the attachment mechanism includes at least one of (a) and (b) as follows: (a) a rail member attached to the body member, the rail member having a dovetail shape and configured to slide into a corresponding dovetail receiver channel of the protective case for the electronic device to removably attach the accessory module to the protective case, the rail member including a snap feature having an interference fit with a corresponding snap feature of the dovetail receiver channel to removably lock the rail member into the dovetail receiver channel of the protective case when the dovetail rail member is inserted into the dovetail receiver channel, and (b) a dovetail receiver channel attached to the body member, the dovetail receiver channel having a dovetail shape and configured to receive a corresponding dovetail rail member of the protective case for the electronic device to removably attach the accessory module to the protective case, the rail member including a snap feature having an interference fit with a corresponding snap feature of the dovetail receiver channel to removably lock the rail member into the dovetail receiver channel when the dovetail rail member is inserted into the dovetail receiver channel.

Another example is a protective case of any of the examples herein where the receiver channel and the lip comprise a dovetail slot in the outer shell.

Another example is a protective case of any of the examples herein where the receiver channel has a cross sectional size at a first end of the receiver channel that differs from a cross sectional size of the receiver channel at a second end of the receiver channel.

Another example is a protective case of any of the examples herein where the rail member is insertable into the receiver channel from the first end and the cross sectional size at the first end is larger than the cross sectional size at the second end such that a clearance gap between the receiver channel and the rail member decreases as an increasing amount of the rail member is inserted into the receiver channel.

Another example is a protective case of any of the examples herein where the receiver channel includes a draft.

Another example is a protective case of any of the examples herein where the snap feature is in the receiver channel.

Another example is a protective case of any of the examples herein where the snap feature includes a ridge configured to rest in a groove of the rail member.

Another example is a protective case of any of the examples herein where the attachment mechanism includes a second snap feature, the second snap feature has an interference fit with a second corresponding snap feature of the rail member to further removably lock the rail member into the receiver channel when the rail member is inserted into the receiver channel.

Another example is a protective case of any of the examples herein where the snap feature and the second snap feature of the attachment mechanism are at opposing ends of the receiver channel.

Another example is a protective case of any of the examples herein where the second snap feature includes at least one of a ball and a detent.

Another example is a protective case of any of the examples herein where at least one of the snap feature and the second snap feature is configured to apply force to the attached accessory in a direction substantially perpendicular to the receiver channel to reduce rattling and/or movement of the attached accessory relative to the protective case.

Another example is a protective case of any of the examples herein wherein the second aperture includes a second attachment mechanism.

Another example is a protective case of any of the examples herein where the second attachment mechanism includes an engagement feature extending around at least a portion of a perimeter of the second aperture for attaching a second accessory to the protective case proximate the second aperture.

Another example is a protective case of any of the examples herein where the engagement feature includes one or more of a recess, a lip, a ridge, a hole, a slot, and a groove.

Another example is a protective case of any of the examples herein where the external electrical interface of the electronic device is accessible when the electronic device is installed in the protective case, the attachment mechanism positioned to enable the attached accessory to interface to the external electrical interface of the electronic device when the accessory is attached to the protective case at the attachment mechanism.

Another example is a protective case of any of the examples herein further including an anchor point on at least one side of the protective case for receiving and removably retaining a portion of the accessory.

Another example is a protective case of any of the examples herein where the anchor point includes one or more of a recess, a lip, a ridge, a hole, a slot, and a groove.

Another example is a protective case of any of the examples herein where the attachment mechanism is located on a bottom portion of the protective case and the anchor point is on a top portion of the protective case.

Another example is a protective case of any of the examples herein further comprising a button pad for actuating a button of the installed electronic device from an outer surface of the protective case.

Another example is a protective case of any of the examples herein where a side of the outer shell includes a cutout area in which a portion of the inner liner extends to an outer surface of the outer shell, and wherein the button pad is formed in the portion of the inner liner in the cutout area.

Another example is a protective case of any of the examples herein further comprising a third aperture in a side of the protective case for accessing a switch of the installed electronic device.

Another example is a protective case of any of the examples herein wherein the inner liner is comolded with the outer shell.

Another example is a protective case of any of the examples herein where the inner liner comprises a material that is softer than a material of the outer shell.

In another example, a modular case system for use with an electronic device has a touchscreen interface, a camera, and an external electrical interface comprises: an accessory module for use with the electronic device, the accessory module has at least one of a rail member and a receiving channel and the protective case of any of the other examples herein is removably attachable to the accessory module.

The elements, components, and steps described herein are meant to exemplify some types of possibilities. In no way should the aforementioned examples limit the scope of the invention, as they are only exemplary embodiments.

The phrases "in some embodiments," "according to some embodiments," "in the embodiments shown," "in other embodiments," "in some examples," "in other examples," "in some cases," "in some situations," "in one configuration," "in another configuration," and the like generally mean that the particular technique, feature, structure, or characteristic following the phrase is included in at least one embodiment of the present invention and/or may be included in more than one embodiment of the present invention. In addition, such phrases do not necessarily refer to the same embodiments or to different embodiments.

The foregoing disclosure has been presented for purposes of illustration and description. Other modifications and variations may be possible in view of the above teachings. The embodiments described in the foregoing disclosure were chosen to explain the principles of the concept and its practical application to enable others skilled in the art to best utilize the invention. It is intended that the claims be construed to include other alternative embodiments of the invention except as limited by the prior art.

The invention claimed is:

1. A protective case for an electronic device having a touchscreen interface, a camera, and an external electrical interface, the protective case comprising:
   an inner liner for receiving and at least partially enclosing the electronic device;
   a first aperture in the protective case permitting access to the touchscreen interface of the electronic device when the electronic device is installed in the protective case;
   a second aperture in a back surface of the protective case permitting optical access to the camera of the installed electronic device; and
   an outer shell including an attachment mechanism for attaching an accessory to the protective case, the attachment mechanism including a receiver channel to slidably receive a rail member of the accessory to removably attach the accessory to the protective case, the receiver channel including a lip for retaining the rail member in the receiver channel, the attachment mechanism further including a snap feature, the snap feature having an interference fit with a corresponding snap feature of the rail member of the accessory to removably lock the rail member into the receiver channel of the outer shell when the rail member is inserted into the receiver channel.

2. The protective case of claim 1 wherein the receiver channel and the lip comprise a dovetail slot in the outer shell.

3. The protective case of claim 1, the receiver channel having a cross sectional size at a first end of the receiver channel that differs from a cross sectional size of the receiver channel at a second end of the receiver channel.

4. The protective case of claim 3 wherein the rail member is insertable into the receiver channel from the first end and the cross sectional size at the first end is larger than the cross sectional size at the second end such that a clearance gap between the receiver channel and the rail member decreases as an increasing amount of the rail member is inserted into the receiver channel.

5. The protective case of claim 1 wherein the receiver channel includes a draft.

6. The protective case of claim 1 wherein the snap feature is in the receiver channel.

7. The protective case of claim 6 wherein the snap feature includes a ridge configured to rest in a groove of the rail member.

8. The protective case of claim 1 wherein the attachment mechanism includes a second snap feature, the second snap feature having an interference fit with a second corresponding snap feature of the rail member to further removably lock the rail member into the receiver channel when the rail member is inserted into the receiver channel.

9. The protective case of claim 8 wherein the snap feature and the second snap feature of the attachment mechanism are at opposing ends of the receiver channel.

10. The protective case of claim 8 wherein the second snap feature includes at least one of a ball and a detent.

11. The protective case of claim 9 wherein at least one of the snap feature and the second snap feature is configured to apply force to the attached accessory in a direction substantially perpendicular to the receiver channel to reduce rattling and/or movement of the attached accessory relative to the protective case.

12. The protective case of claim 1 wherein the second aperture includes a second attachment mechanism.

13. The protective case of claim 12 wherein the second attachment mechanism includes an engagement feature extending around at least a portion of a perimeter of the second aperture for attaching a second accessory to the protective case proximate the second aperture.

14. The protective case of claim 13 wherein the engagement feature includes one or more of a recess, a lip, a ridge, a hole, a slot, and a groove.

15. The protective case of claim 1 wherein the external electrical interface of the electronic device is accessible when the electronic device is installed in the protective case, the attachment mechanism positioned to enable the attached accessory to interface to the external electrical interface of the electronic device when the accessory is attached to the protective case at the attachment mechanism.

16. The protective case of claim 1 further including an anchor point on at least one side of the protective case for receiving and removably retaining a portion of the accessory.

17. The protective case of claim 16 wherein the anchor point includes one or more of a recess, a lip, a ridge, a hole, a slot, and a groove.

18. The protective case of claim 16 wherein the attachment mechanism is located on a bottom portion of the protective case and the anchor point is on a top portion of the protective case.

19. The protective case of claim 1 further comprising a button pad for actuating a button of the installed electronic device from an outer surface of the protective case.

20. The protective case of claim 19 wherein a side of the outer shell includes a cutout area in which a portion of the inner liner extends to an outer surface of the outer shell, and wherein the button pad is formed in the portion of the inner liner in the cutout area.

21. The protective case of claim 1 further comprising a third aperture in a side of the protective case for accessing a switch of the installed electronic device.

22. The protective case of claim 1 wherein the inner liner is comolded with the outer shell.

23. The protective case of claim 1 wherein the inner liner comprises a material that is softer than a material of the outer shell.

24. A modular case system for use with an electronic device having a touchscreen interface, a camera, and an external electrical interface, the modular case system comprising:
   an accessory module for use with the electronic device, the accessory module having a rail member; and
   a protective case comprising:
      an inner liner for receiving and at least partially enclosing the electronic device;
      a first aperture permitting access to the touchscreen interface of the electronic device when the electronic device is installed in the protective case;
      a second aperture in a back surface of the protective case permitting optical access to the camera of the installed electronic device; and
      an outer shell including an attachment mechanism for attaching the accessory to the protective case, the attachment mechanism including a receiver channel to slidably receive the rail member of the accessory to removably attach the accessory to the protective case, the receiver channel including a lip for retaining the rail member in the receiver channel, the attachment mechanism further including a snap feature, the snap feature having an interference fit with a corresponding snap feature of the rail member of the accessory to removably lock the rail member into the receiver channel of the outer shell when the rail member is inserted into the receiver channel.

25. A protective case for an electronic device having a touchscreen interface, a camera, and an external electrical interface, the protective case comprising:
- an inner liner for receiving and at least partially enclosing the electronic device;
- a first aperture in the protective case permitting access to the touchscreen interface of the electronic device when the electronic device is installed in the protective case;
- a second aperture in a back surface of the protective case permitting optical access to the camera of the installed electronic device; and
- an outer shell including an attachment mechanism for attaching an accessory to the protective case, the attachment mechanism including at least one of (a) and (b) as follows:
- (a) a receiver channel to slidably receive a rail member of the accessory to removably attach the accessory to the protective case, the receiver channel including a lip for retaining the rail member in the receiver channel, the attachment mechanism further including a snap feature, the snap feature having an interference fit with a corresponding snap feature of the rail member of the accessory to removably lock the rail member into the receiver channel of the outer shell when the rail member is inserted into the receiver channel, and
- (b) a rail member for sliding into a receiver channel of the accessory to removably attach the accessory to the protective case, the rail member including an engagement feature for retaining the rail member in the receiver channel, the attachment mechanism further including a snap feature, the snap feature having an interference fit with a corresponding snap feature of the receiver channel of the accessory to removably lock the rail member into the receiver channel when the rail member is inserted into the receiver channel.

26. The protective case of claim 25 wherein the receiver channel and the lip comprise a dovetail slot.

27. The protective case of claim 25, the receiver channel having a cross sectional size at a first end of the receiver channel that differs from a cross sectional size of the receiver channel at a second end of the receiver channel.

28. The protective case of claim 27 wherein the rail member is insertable into the receiver channel from the first end and the cross sectional size at the first end is larger than the cross sectional size at the second end such that a clearance gap between the receiver channel and the rail member decreases as an increasing amount of the rail member is inserted into the receiver channel.

29. The protective case of claim 25 wherein the snap feature is in the receiver channel.

30. The protective case of claim 25 wherein the attachment mechanism includes a second snap feature, the second snap feature having an interference fit with a second corresponding snap feature of the rail member to further removably lock the rail member into the receiver channel when the rail member is inserted into the receiver channel.

31. The protective case of claim 25 further including an anchor point on at least one side of the protective case for receiving and removably retaining a portion of the accessory.

* * * * *

UNITED STATES PATENT AND TRADEMARK OFFICE
CERTIFICATE OF CORRECTION

PATENT NO. : 9,807,211 B2
APPLICATION NO. : 15/062399
DATED : October 31, 2017
INVENTOR(S) : Jonathan H. Guerdrum et al.

Page 1 of 1

It is certified that error appears in the above-identified patent and that said Letters Patent is hereby corrected as shown below:

Column 30, Line 65, in Claim 24, insert --module-- after "accessory"
    Column 30, Line 67, in Claim 24, insert --module-- after "accessory"
    Column 31, Line 1, in Claim 24, insert --module-- after "accessory"
    Column 31, Line 7, in Claim 24, insert --module-- after "accessory"

Signed and Sealed this
Fifth Day of June, 2018

Andrei Iancu
*Director of the United States Patent and Trademark Office*